US012635569B2

(12) United States Patent
Chen

(10) Patent No.: US 12,635,569 B2
(45) Date of Patent: May 19, 2026

(54) LIGHT EMITTING PANEL USEFUL FOR DISPLAY DEVICE WITH PHOTOELECTRIC CONVERSION UNIT BETWEEN TWO ADJACENT FIRST PROJECTIONS

(71) Applicant: Xiamen Tianma Display Technology Co., Ltd., Xiamen (CN)

(72) Inventor: Ran Chen, Xiamen (CN)

(73) Assignee: Xiamen Tianma Display Technology Co., Ltd., Xiamen (CN)

( * ) Notice: Subject to any disclaimer, the term of this patent is extended or adjusted under 35 U.S.C. 154(b) by 909 days.

(21) Appl. No.: 17/902,212

(22) Filed: Sep. 2, 2022

(65) Prior Publication Data

US 2022/0415872 A1     Dec. 29, 2022

(30) Foreign Application Priority Data

Jun. 30, 2022     (CN) .......................... 202210772707.9

(51) Int. Cl.
*H01L 25/16* (2023.01)
*G09G 3/3233* (2016.01)
(Continued)

(52) U.S. Cl.
CPC ......... *H01L 25/167* (2013.01); *G09G 3/3233* (2013.01); *H01L 24/08* (2013.01);
(Continued)

(58) Field of Classification Search
CPC ....... H01L 25/167; H01L 24/08; H01L 24/13; H01L 24/16; H01L 24/11;
(Continued)

(56) References Cited

U.S. PATENT DOCUMENTS

2006/0017055 A1* 1/2006 Cropper ................. H10K 71/00
257/E21.042
2008/0284341 A1 11/2008 Weng
(Continued)

FOREIGN PATENT DOCUMENTS

CN     110147007 A     8/2019
CN     110277053 B     12/2020
(Continued)

*Primary Examiner* — William B Partridge
*Assistant Examiner* — Linda J. Fleck
(74) *Attorney, Agent, or Firm* — KDW Firm PLLC

(57) ABSTRACT

Provided are a light-emitting panel and a display device. The light-emitting panel includes a driving substrate and a plurality of light-emitting elements. The driving substrate includes a base substrate, a plurality of driver circuits, and a plurality of photoelectric conversion units. The driver circuits and the photoelectric conversion units are located on the base substrate. A photoelectric conversion unit includes a first doped region and a second doped region. The light-emitting elements are located on a side of the driving substrate. The orthographic projection of a light-emitting element among at least part of the light-emitting elements on the driving substrate is a first projection. An orthographic projection of the photoelectric conversion unit on the driving substrate is located between two adjacent first projections. A driver circuit and the photoelectric conversion unit are each electrically connected to the light-emitting element.

17 Claims, 15 Drawing Sheets

(51) Int. Cl.

| | |
|---|---|
| *H01L 23/00* | (2006.01) |
| *H10F 19/50* | (2025.01) |
| *H10K 59/131* | (2023.01) |
| *H10K 59/60* | (2023.01) |
| *H10K 59/80* | (2023.01) |

(52) U.S. Cl.
CPC .............. *H01L 24/13* (2013.01); *H01L 24/16* (2013.01); *H10F 19/50* (2025.01); *H10K 59/60* (2023.02); *H10K 59/878* (2023.02); *G09G 2300/0842* (2013.01); *G09G 2320/0233* (2013.01); *G09G 2330/021* (2013.01); *H01L 24/11* (2013.01); *H01L 2224/08145* (2013.01); *H01L 2224/1162* (2013.01); *H01L 2224/13021* (2013.01); *H01L 2224/16145* (2013.01); *H01L 2924/12041* (2013.01); *H10K 59/131* (2023.02); *H10K 59/8792* (2023.02)

(58) Field of Classification Search
CPC ... H01L 2224/08145; H01L 2224/1162; H01L 2224/13021; H01L 2224/16145; H01L 2924/12041; G09G 3/3233; G09G 3/0842; G09G 3/0233; G09G 3/021; G09G 3/0819; G09G 3/0861; G09G 2310/0262; G09G 2310/148; H10F 19/50; H10F 55/00; H10F 77/48; H10K 59/60; H10K 59/878; H10K 59/131; H10K 59/8792; H10H 20/855; H10H 20/856

See application file for complete search history.

(56) References Cited

U.S. PATENT DOCUMENTS

| | | | | |
|---|---|---|---|---|
| 2016/0155782 | A1* | 6/2016 | Sato ........................ | H10F 10/17 257/82 |
| 2019/0131466 | A1* | 5/2019 | Dotta .................... | H10F 77/211 |
| 2019/0154156 | A1* | 5/2019 | Sakakura ................ | F04D 29/12 |
| 2020/0127064 | A1* | 4/2020 | Ikeda .................... | H10K 59/60 |
| 2020/0350374 | A1 | 11/2020 | Yuan | |
| 2021/0158005 | A1* | 5/2021 | Liu .................... | G06V 40/1306 |
| 2021/0200366 | A1* | 7/2021 | Bok ........................ | G06V 10/17 |
| 2022/0190200 | A1* | 6/2022 | Yu ........................... | G06F 3/044 |

FOREIGN PATENT DOCUMENTS

| | | |
|---|---|---|
| CN | 112133718 A | 12/2020 |
| CN | 113488501 A | 10/2021 |

* cited by examiner

200

LIGHT EMITTING PANEL USEFUL FOR DISPLAY DEVICE WITH PHOTOELECTRIC CONVERSION UNIT BETWEEN TWO ADJACENT FIRST PROJECTIONS

CROSS-REFERENCE TO RELATED APPLICATION(S)

This application claims priority to Chinese Patent Application No. 202210772707.9 filed Jun. 30, 2022, the disclosure of which is incorporated herein by reference in its entirety.

TECHNICAL FIELD

The present disclosure relates to the field of display technology and, in particular, to a light-emitting panel and a display device.

BACKGROUND

With the development of display technology, more and more electronic devices are integrated with display function layers, bringing great convenience to the way people live, travel, and work. A light-emitting panel used for display and light emission is an important part of an electronic device with a display function.

However, in the related art, when the light-emitting panel performs display and emits light, only part of the light can be emitted to a light emission surface of the light-emitting panel. However, some light may be limited in a layer of the light-emitting panel and cannot be emitted to the light emission surface of the light-emitting panel, resulting in a waste of light, thereby making the light utilization of the light-emitting panel relatively low, and being unfavorable for a further improvement of the low power consumption and contrast ratio of the light-emitting panel.

SUMMARY

The present disclosure provides a light-emitting panel and a display device to improve the light utilization of the light-emitting panel, further improving the contrast ratio of the light-emitting panel and being beneficial to the low power consumption of the light-emitting panel.

According to an aspect of the present disclosure, a light-emitting panel is provided. The light-emitting panel includes a driving substrate and a plurality of light-emitting elements.

The driving substrate includes a base substrate, a plurality of driver circuits, and a plurality of photoelectric conversion units. The driver circuits and the photoelectric conversion units are located on the base substrate. A photoelectric conversion unit includes a first doped region and a second doped region.

The light-emitting elements are located on a side of the driving substrate. The orthographic projection of a light-emitting element among at least part of the light-emitting elements on the driving substrate is a first projection. the orthographic projection of the photoelectric conversion unit on the driving substrate is located between two adjacent first projections. A driver circuit and the photoelectric conversion unit are each electrically connected to the light-emitting element.

According to another aspect of the present disclosure, a display device is provided. The display device includes the preceding light-emitting panel.

It is to be understood that the contents described in this part are not intended to identify key or important features of the embodiments of the present disclosure and are not intended to limit the scope of the present disclosure. Other features of the present disclosure will become readily understood through the description hereinafter.

BRIEF DESCRIPTION OF DRAWINGS

To illustrate solutions in embodiments of the present invention more clearly, the accompanying drawings used in description of the embodiments will be briefly described below. Apparently, the accompanying drawings described below illustrate part of embodiments of the present invention, and those of ordinary skill in the art may obtain other accompanying drawings based on the accompanying drawings described below on the premise that no creative work is done.

DETAILED DESCRIPTION

Figure 1:
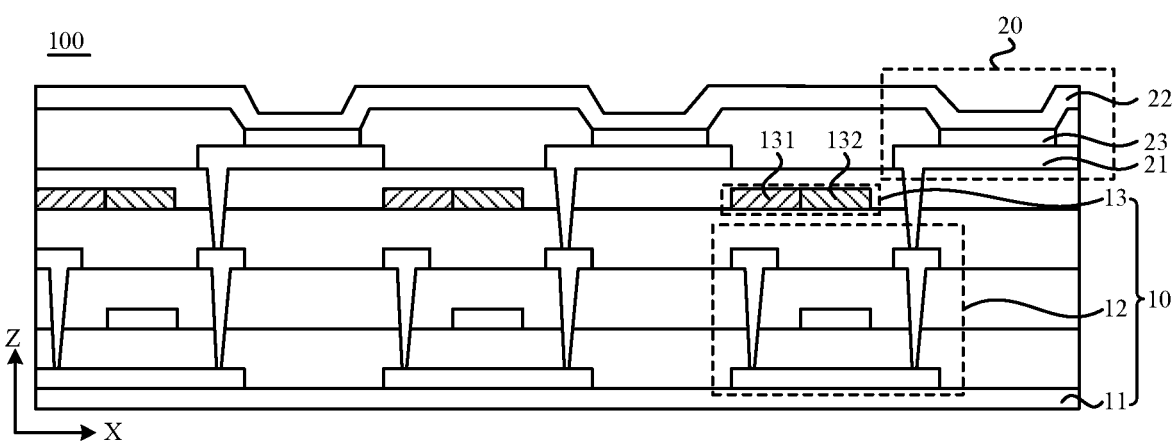
FIG. 1 is a diagram illustrating the layer structure of a light-emitting panel according to an embodiment of the present disclosure.

The solutions in embodiments of the present disclosure will be described clearly and completely in conjunction with the drawings in the embodiments of the present disclosure from which the solutions will be better understood by those skilled in the art. Apparently, the embodiments described below are part, not all, of the embodiments of the present disclosure. Based on the embodiments described herein, all other embodiments obtained by those skilled in the art on the premise that no creative work is done are within the scope of the present disclosure.

It is to be noted that the terms "first", "second" and the like in the description, claims and drawings of the present disclosure are used to distinguish between similar objects and are not necessarily used to describe a particular order or sequence. It should be understood that the data used in this way is interchangeable where appropriate so that the embodiments of the present disclosure described herein may also be implemented in a sequence not illustrated or described herein. In addition, the terms "comprising", "including" or any other variations thereof herein are intended to encompass a non-exclusive inclusion. For example, a product or device that includes a series of structures or units not only includes the expressly listed structures or units but may also include other structures or units that are not expressly listed or are inherent to such product or device.

As described in the background, the light emitted by light-emitting elements in a light-emitting panel in the related art is not totally emitted to a light emission surface of the light-emitting panel. Only a part of the light is emitted to the light emission surface of the light-emitting panel. The other part is limited to function layers of the light-emitting panel and cannot be used, thereby affecting the light utilization of the entire light-emitting panel. Moreover, when the light utilization of the light-emitting panel is relatively low, driver circuits are required to provide higher drive signals for the light-emitting elements to implement relatively high display brightness, thereby being unfavorable for a further improvement of the low power consumption and contrast ratio of the light-emitting panel.

To solve the preceding problem, embodiments of the present disclosure provide a light-emitting panel. The light-emitting panel includes a driving substrate and a plurality of light-emitting elements. The driving substrate includes a base substrate, a plurality of driver circuits, and a plurality of photoelectric conversion units. The driver circuits and the photoelectric conversion units are located on the base substrate. A photoelectric conversion unit includes a first doped region and a second doped region.

The light-emitting elements are located on a side of the driving substrate. The orthographic projection of a light-emitting element among at least part of the light-emitting elements on the driving substrate is a first projection. The orthographic projection of the photoelectric conversion unit on the driving substrate is located between two adjacent first projections. A driver circuit and the photoelectric conversion unit are each electrically connected to the light-emitting element.

In the preceding technical solutions, the arrangement in which the photoelectric conversion unit is disposed in the driving substrate enables the photoelectric conversion unit to convert, based on photoelectric conversion principles, part of optical signals emitted by the light-emitting element and not emitted to the light emission surface of the light-emitting panel into electrical signals and supply the electrical signals to the light-emitting element so that an electrical signal converted from an optical signal can be used, thereby improving the light utilization of the light-emitting panel. Moreover, the electrical signal converted by the photoelectric conversion unit can be supplied to the light-emitting element directly to enable the light-emitting element to acquire additional electric energy. In this case, an electrical signal supplied to the light-emitting element by the driver circuit can be reduced appropriately when the light-emitting element maintains certain display brightness, thereby being beneficial to the low power consumption of the light-emitting panel. Moreover, when the electrical signal supplied by the driver circuit remains constant, the additional electrical signal supplied to the light-emitting element by the photoelectric conversion unit can further improve the display brightness of the light-emitting element, further improving the display brightness of the light-emitting panel and the contrast ratio of the light-emitting panel. Additionally, the arrangement in which the photoelectric conversion unit is located between first projections of light-emitting elements on the driving substrate makes the photoelectric conversion unit not occupy a space for disposing the light-emitting element and a connection structure of the light-emitting element and fully receive the optical signal not emitted to the light emission surface of the light-emitting panel, thereby enabling optical signals in the light-emitting panel to be fully used on the premise that the light-emitting panel maintains a due resolution.

The preceding is the core idea of the present application. Technical solutions in embodiments of the present disclosure are described clearly and completely below in conjunction with the drawings in embodiments of the present disclosure. Apparently, the embodiments described below are part, not all, of embodiments of the present disclosure. Based on embodiments of the present disclosure, all other embodiments obtained by those of ordinary skill in the art without creative work are within the scope of the present disclosure.

Figure 2:
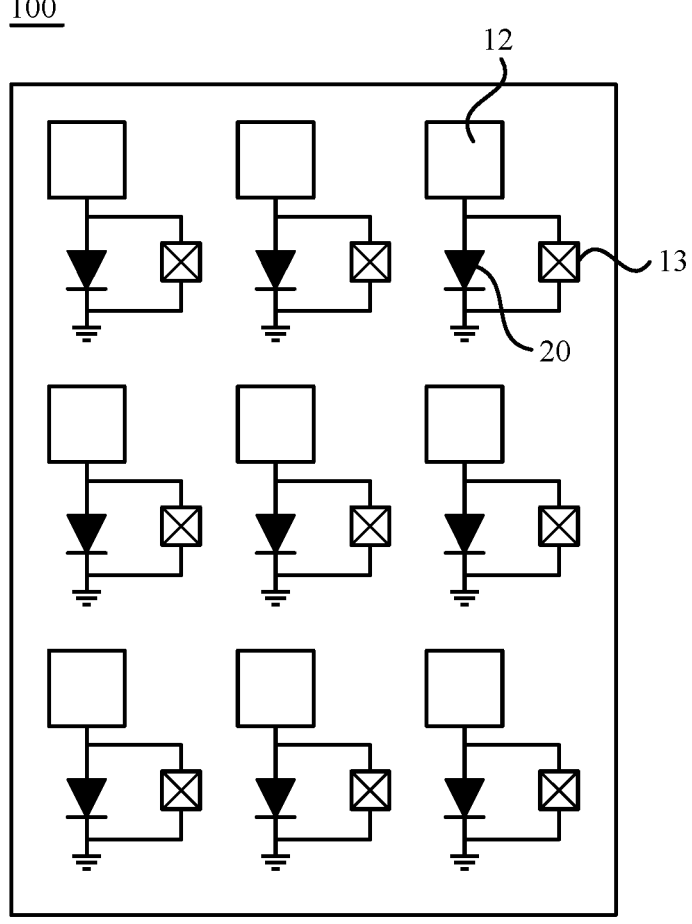
FIG. 2 is a top view illustrating the structure of the light-emitting panel according to an embodiment of the present disclosure.

FIG. 1 is a diagram illustrating the layer structure of a light-emitting panel according to an embodiment of the present disclosure. FIG. 2 is a top view illustrating the structure of the light-emitting panel according to an embodiment of the present disclosure. With combined reference to FIGS. 1 and 2, the light-emitting panel 100 includes a driving substrate 10. The driving substrate 10 includes a base substrate 11, a plurality of driver circuits 12, and a plurality of photoelectric conversion units 13. The driver circuits 12 and the photoelectric conversion units 13 are located on the base substrate 11. A photoelectric conversion unit 13 includes a first doped region 131 and a second doped region 132. The doping type of the first doped region 131 is different from the doping type of the second doped region 132. For example, the first doped region 131 may be an n-type doped region, and the second doped region 132 may be a p-type doped region. In this case, if the first doped region 131 is in contact with the second doped region 132, the first doped region 131 and the second doped region 132 form a PN junction. The PN junction can convert a received optical signal into an electrical signal based on the photoelectric conversion effect.

A driver circuit 12 may include an active component and/or a passive component. No special limitation is made thereto in embodiments of the present disclosure. It is to be understood that the active component includes a three-terminal or multiple-terminal component such as a transistor and that the passive component includes a component without a control terminal, for example, a resistor, a capacitor, or an inductor.

Figure 3:
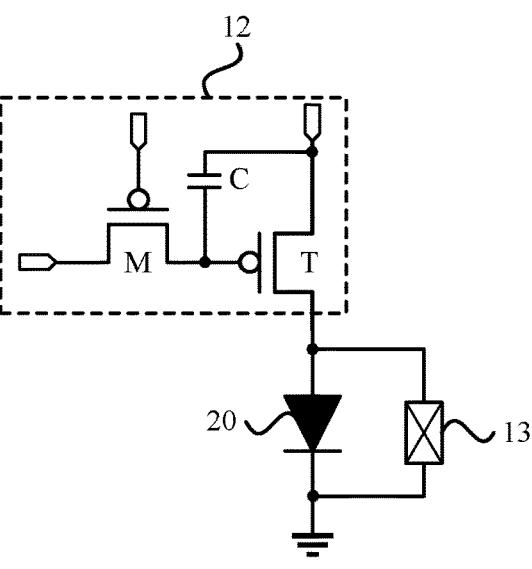
FIG. 3 is a diagram illustrating the structure of a driver circuit according to an embodiment of the present disclosure.

In an embodiment, as shown in FIG. 3, the driver circuit 12 in the light-emitting panel 100 may be a typical 2T1C circuit. That is, the driver circuit 12 includes a data write transistor M, a drive transistor T, and a storage capacitor C. The data write transistor M may turn on or off under the control of a scan signal. Moreover, when the data write transistor M is in the on state, the data write transistor M can write a data signal to a gate of the drive transistor T. Under the combined action of the data signal at the gate of the drive transistor T and a positive power signal received by a first pole of the drive transistor T, the drive transistor T generates a drive current to serve as a drive signal.

It is to be noted that FIG. 3 is only an exemplary illustration of the driver circuit. In other embodiments of the present disclosure, the driver circuit may also have another circuit structure. No special limitations are made thereto in embodiments of the present disclosure. For ease of description, FIG. 1 exemplifies a structure in which a transistor replaces a driver circuit.

It is to be understood that when working, the driver circuit 12 and the photoelectric conversion unit 13 that are located on a side of the base substrate 11 generate certain heat. When accumulated in the driving substrate 10, the heat in this part may affect the service life of each component. Accordingly, the heat in the driving substrate 10 may be dissipated through the base substrate 11. In this case, the base substrate 11 may be a substrate with a relatively high thermal conductivity. In an embodiment, the thermal conductivity of the base substrate 11 may be greater than or equal to 1000 W/m·K. For example, the base substrate 11 may be a diamond substrate or a diamond-like substrate. No special limitation is made thereto in embodiments of the present disclosure on the premise that core invention points of embodiments of the present disclosure can be implemented.

With continued reference to FIGS. 1 and 2, the light-emitting panel 100 further includes a plurality of light-emitting elements 20 located on a side of the driving substrate 10. The orthographic projection of a light-emitting element 20 among at least part of the light-emitting elements 20 on the driving substrate 10 is a first projection. The orthographic projection of the photoelectric conversion unit 13 on the driving substrate 10 is located between two adjacent first projections. That is, the photoelectric conversion unit 13 is disposed at a gap between two light-emitting elements 20. The driver circuit 12 and the photoelectric conversion unit 13 are each electrically connected to the light-emitting element 20. In this case, the driver circuit 12 can supply a drive signal to the light-emitting element 20, and the photoelectric conversion unit 13 can convert an optical signal into an electrical signal and supply the electrical signal to the light-emitting element 20. Accordingly, the light-emitting element 20 emits light under the combined action of the drive signal supplied by the driver circuit 12 and the electrical signal supplied by the photoelectric conversion unit 13.

Figure 4:
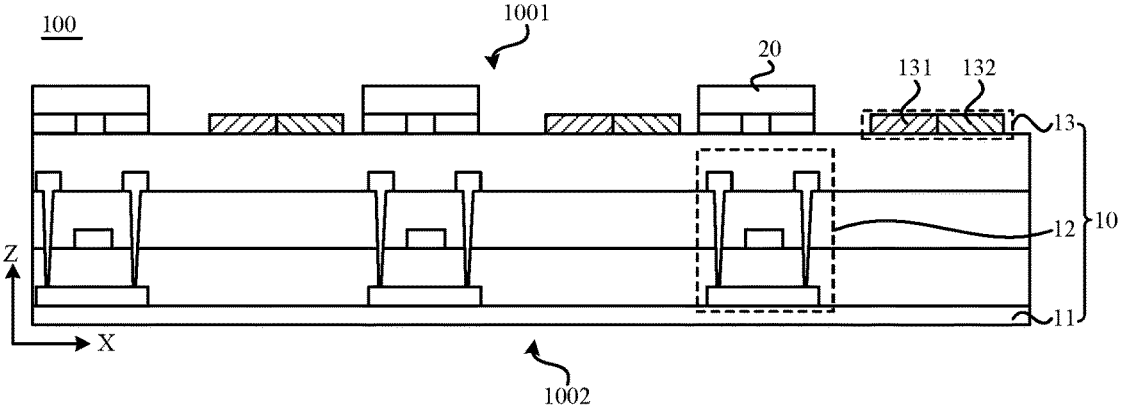
FIG. 4 is a diagram illustrating the layer structure of another light-emitting panel according to an embodiment of the present disclosure.

It is to be understood that the light-emitting element 20 may include but is not limited to an OLED, a micro-LED, or a mini-LED. In an optional embodiment, the light-emitting element 20 may be an OLED. In this case, as shown in FIG. 1, the light-emitting element 20 includes a first electrode 21, a second electrode 22, and a light-emitting function layer 23 located between the first electrode 21 and the second electrode 22. With this arrangement, after each structure of the driving substrate 10 is formed, layers of the light-emitting element 20 are formed directly on a side of the driving substrate in the manner of evaporation. In another optional embodiment, as shown in FIG. 4, the light-emitting element 20 may also be a micro-light-emitting element (for example, a micro-LED or a mini-LED) with a relatively small size so that the light-emitting panel 100 has a relatively high resolution. Moreover, the light-emitting panel 100 may display an image directly; alternatively, the light-emitting panel 100 may be used as a light source of another light-emitting panel. No special limitation is made thereto in embodiments of the present disclosure. For ease of description, in embodiments of the present disclosure, an example is taken in which the light-emitting element is a micro-light-emitting element with a relatively small size and in which the light-emitting panel can display an image directly so that basic solutions in embodiments of the present disclosure are described exemplarily.

With combined reference to FIGS. 2 and 4, when the light-emitting element 20 emits light, part of the light is emitted toward a side facing a light emission surface 1001 of the light-emitting panel 100 so that partial light among this part of the light can reach the light emission surface 1001 of the light-emitting panel 100 and be used for displaying a corresponding image. The other part of the light may be emitted to a gap between light-emitting elements 20 and toward a side of the light-emitting element 20 facing the driving substrate 10; and at least partial light among this part of the light can be received by the photoelectric conversion unit 13, converted into an electrical signal by the photoelectric conversion unit 13 in the driving substrate 10, and supplied to the light-emitting element 20. In this case, the at least partial light can be reused so as to improve the utilization of the light emitted by the light-emitting element 20.

Moreover, the photoelectric conversion unit 13 converts a received optical signal into an electrical signal based on the photoelectric conversion effect. Thus the existence of the photoelectric conversion unit 13 does not consume electric energy. On the contrary, the photoelectric conversion unit 13 can supply the additional electrical signal to the light-emitting element 20. In this case, a relatively small power signal and/or a relatively small data signal is supplied to the driver circuit 12 so that the light-emitting element 20 can have relatively high display brightness. Moreover, the voltage value of the power signal supplied to the driver circuit 12 and the voltage value of the data signal supplied to the driver circuit 12 are generally positively correlated with the power consumption of the light-emitting panel 100; that is, the lower the voltage of the power signal and/or the voltage of the data signal, the lower the power consumption of the light-emitting panel 100. Thus the reduction of the power signal supplied to the driver circuit 12 and/or the reduction of the data signal supplied to the driver circuit 12 helps reduce the power consumption of the light-emitting panel 100.

Additionally, within a certain display brightness range, the display brightness of the light-emitting element 20 is positively correlated with a current supplied to the light-emitting element 20; that is, the larger the current supplied to the light-emitting element 20, the greater the display brightness of the light-emitting element 20. Accordingly, on the premise that the power signal supplied to the driver circuit 12 and the data signal supplied to the driver circuit 12 remain unchanged, the current value of a drive signal supplied to the light-emitting element 20 by the driver circuit 12 is constant. In this case, the additional electrical signal is supplied to the light-emitting element 20 by the photoelectric conversion unit 13 so that the current flowing through the light-emitting element 20 further increases, improving the display brightness of the light-emitting element 20, thereby improving the display brightness of the light-emitting panel 100, expanding the display brightness range of the light-emitting element 20, and improving the contrast ratio of the light-emitting panel 100.

It is to be understood that the driver circuit 12 and the photoelectric conversion unit 13 are disposed on the same side of the base substrate 11 in the driving substrate 10. That is, the photoelectric conversion unit 13 and the driver circuit 12 may be formed in the same manufacturing process. Thus the manufacturing process does not need to be transferred for disposing the photoelectric conversion unit 13, simplifying the manufacturing process of the light-emitting panel 100. Each component in the driver circuit 12 and the photoelectric conversion unit 13 may be located in the same layer or different layers. No special limitation is made thereto in embodiments of the present disclosure. Additionally, since the driver circuit 12 is used for driving the light-emitting element 20 to emit light, the driver circuits 12 need to be disposed in one-to-one correspondence with the light-emitting elements 20 through corresponding connection structures 14. The arrangement in which the photoelectric conversion unit 13 is located between first projections of light-emitting elements 20 on the driving substrate 10 makes the photoelectric conversion unit 13 not occupy a space for disposing the light-emitting element 20 and a connection structure 14 of the light-emitting element 20, thereby guaranteeing that the light-emitting panel 100 maintains a due resolution. Moreover, the light-emitting element 20 is located on a side of the driving substrate; that is, the light-emitting element 20 may be located on a side of the photoelectric conversion unit 13 facing away from the base substrate 11 so that the photoelectric conversion unit 13 can receive not only an optical signal emitted by the light-emitting element 20 to a gap between adjacent light-emitting elements 20 but also an optical signal emitted by the light-emitting element 20 and toward a side of the driving substrate 10. Accordingly, optical signals emitted by the light-emitting element 20 in the light-emitting panel 100 can be fully used.

Figure 5:
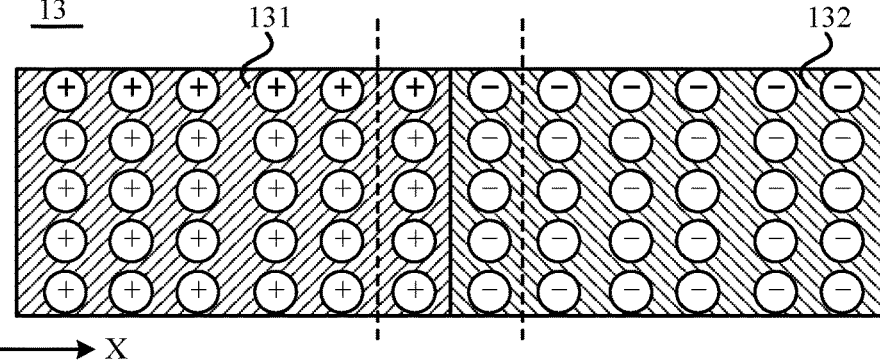
FIG. 5 is a top view illustrating the structure of a PN junction according to an embodiment of the present disclosure.

In an embodiment, FIG. 5 is a top view illustrating the structure of a PN junction according to an embodiment of the present disclosure. With combined reference to FIGS. 4 and 5, when the photoelectric conversion unit 13 includes the PN junction, the first doped region 131 and the second doped region 132 may be arranged in a first direction X. The first direction X is parallel to a plane where the base substrate 11 is located.

In an embodiment, when the first doped region 131 of the photoelectric conversion unit 13 and the second doped region 132 of the photoelectric conversion unit 13 are arranged in the first direction X, the first doped region 131 and the second doped region 132 may be located in the same layer. That is, the layer of the first doped region 131 and the layer of the second doped region 132 may be formed in the same manufacturing process using the same material, simplifying the manufacturing process of the light-emitting panel 100. Moreover, the first doped region 131 and the second doped region 132 are arranged in the first direction; that is, the first doped region 131 and the second doped region 132 are in the same plane. The arrangement in which the first doped region 131 and second doped region 132 of the same photoelectric conversion unit 13 do not block each other enables both the first doped region 131 and the second doped region 132 to receive optical signals so that the photoelectric conversion unit 13 has a relatively large optical signal receiving surface, thereby increasing the number of optical signals received by the photoelectric conversion unit 13 and enabling the photoelectric conversion unit 13 to convert more optical signals into electrical signals. Further, on the premise of improving light utilization, the photoelectric conversion efficiency can also be improved, which is beneficial to the low power consumption of the light-emitting panel 100 and the further improvement of display brightness.

It is to be understood that when the photoelectric conversion unit 13 includes the PN junction, in the same photoelectric conversion unit 13, one of the first doped region 131 and the second doped region 132 is a p-type doped region, and the other of the first doped region 131 and the second doped region 132 is an n-type doped region. An example is taken in which the first doped region 131 and the second doped region 132 are an n-type doped region and a p-type doped region respectively. For the n-type doped region 131, after an element such as phosphorus, arsenic, or antimony, is doped in a layer, negatively charged electrons may be generated so that the concentration of free electrons in the n-type doped region is higher than the concentration of holes. For the p-type doped region 132, after an element such as boron, indium, or gallium is doped in a layer, holes that can capture electrons may be generated so that the concentration of holes in the n-type doped region 131 is higher than the concentration of electrons. The concentration of electrons in the n-type doped region 131 is much higher than the concentration of electrons in the p-type doped region 132. The concentration of holes in the p-type doped region 132 is much higher than the concentration of holes in the n-type doped region 131. In this case, when the p-type doped region 132 and the n-type doped region 131 are in close contact, the difference between the carrier concentration of the p-type doped region 132 and the carrier concentration of the n-type doped region 131 causes a carrier diffusion movement to occur near the contact surface between the p-type doped region 132 and the n-type doped region 131. Thus electrons in the n-type doped region 131 diffuse toward a side of the p-type doped region 132, and holes in the p-type doped region 132 diffuse toward the n-type doped region 131. On a side of the n-type doped region 131, with the diffusion of electrons toward the p-type doped region 132, impurities doped in the n-type doped region 131 change into cations so that a cation thin layer is formed in a region of the n-type doped region 131 near the contact surface between the p-type doped region 132 and the n-type doped region 131. On a side of the p-type doped region 132, with the diffusion of holes toward the n-type doped region 131, impurities doped in the p-type doped region 132 change into anions so that an anion thin layer is formed in a region of the p-type doped region 132 near the contact surface between the p-type doped region 132 and the n-type doped region 131. The region composed of the cation thin layer and the anion thin layer is a space charge region (also referred to as a depletion layer) of the PN junction. An electric field directed from the n-type doped region 131 to the p-type doped region 132 is generated in the space charge region. The electric field is a built-in electric field.

Correspondingly, when the photoelectric conversion unit 13 receives an optical signal, photons of the optical signal can separate electrons in the n-type doped region 131 and the p-type doped region 132 from holes in the n-type doped region 131 and the p-type doped region 132 to generate electron-hole pairs. Before recombination, electrons and holes near the contact surface between the p-type doped region 132 and the n-type doped region 131 are separated from each other by the electric field action of the space charge region. Electrons move toward the positively charged n-type doped region 131, and holes move toward the negatively charged p-type doped region 132. In this case, a voltage is generated between the p-type doped region 132 and the n-type doped region 131, thereby implementing photoelectric conversion. The greater the number of optical signals received by the PN junction, the more the generated electron-hole pairs and the larger the generated current. Therefore, when the n-type doped region 131 and the p-type doped region 132 are arranged in the first direction X, the photoelectric conversion unit 13 has a relatively large light receiving area for receiving optical signals so as to receive more optical signals. Thus the photoelectric conversion unit 13 has relatively high photoelectric conversion efficiency.

Figure 6:
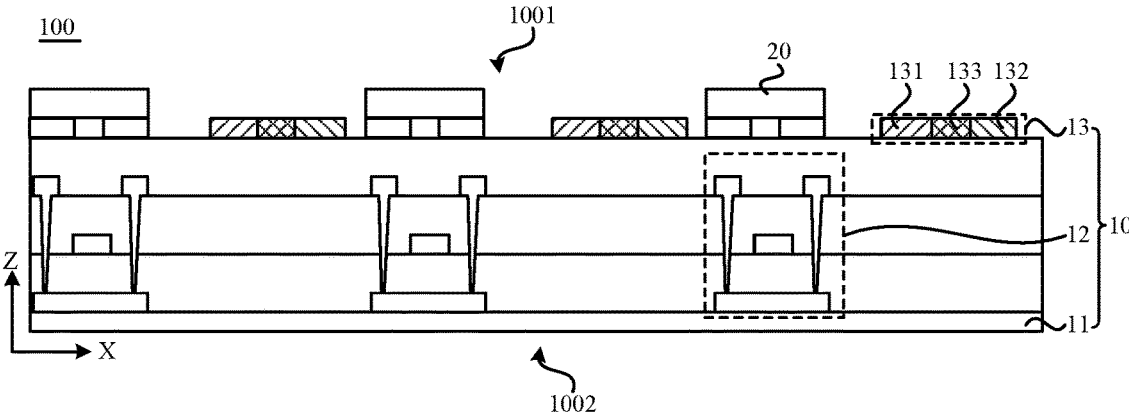
FIG. 6 is a diagram illustrating the layer structure of another light-emitting panel according to an embodiment of the present disclosure.
Figure 7:
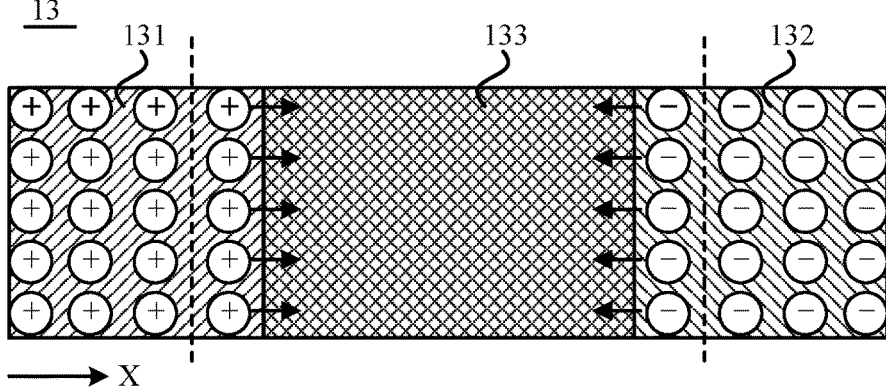
FIG. 7 is a top view illustrating the structure of a PIN junction according to an embodiment of the present disclosure.

In another optional embodiment, FIG. 6 is a diagram illustrating the layer structure of another light-emitting panel according to an embodiment of the present disclosure. FIG. 7 is a top view illustrating the structure of a PIN junction according to an embodiment of the present disclosure. With combined reference to FIGS. 6 and 7, the photoelectric conversion unit 13 may include the PIN junction. In this case, the photoelectric conversion unit 13 includes the first doped region 131, the second doped region 132, and an intrinsic region 133. The first doped region 131, the intrinsic region 133, and the second doped region 132 are arranged in sequence in the first direction X. The first direction X is parallel to the plane where the base substrate is located.

It is to be understood that the intrinsic region 133 of the PIN junction is a region that is not doped or a region whose doping concentration is much lower than the doping concentration of the first doped region 131 and the doping concentration of the second doped region 132. Similarly, an example is taken in which the first doped region 131 and the second doped region 132 are an n-type doped region and a p-type doped region respectively. The arrangement in which the intrinsic region 133 is added between the first doped region 131 and the second doped region 132 makes a difference exist between the carrier concentration of the first doped region 131 and the carrier concentration of the intrinsic region 133 and a difference exist between the carrier concentration of the second doped region 132 and the carrier concentration of the intrinsic region 133. Thus electrons in the first doped region 131 diffuse toward the intrinsic region 133, and holes in the second doped region 132 also diffuse toward the intrinsic region 133. Accordingly, the PIN junction composed of the first doped region 131, the intrinsic region 133, and the second doped region 132 has a relatively wide depletion layer so that the light absorption process of the PIN junction and the transmission process of carriers are effectively separated, thereby achieving a higher photoelectric conversion response rate and improving the photoelectric conversion efficiency of the photoelectric conversion unit 13. Moreover, since the first doped region 131 and the second doped region 132 may serve as carrying bodies for carrier transportation, the first doped region 131 and the second doped region 132 may be optionally doped with an n-type doping material with a relatively wide band gap and a p-type doping material with a relatively wide band gap respectively so as to further improve the photoelectric conversion efficiency of the photoelectric conversion unit including the PIN junction. Additionally, by changing the length of the first doped region 131 in the first direction X and the length of the second doped region 132 in the first direction X, the intrinsic region 133 may be located in the position where the optical field is the strongest. In this case, the photoelectric conversion performance of the photoelectric conversion unit is also improved.

For ease of description and simplification of the drawings, an example in which the photoelectric conversion unit includes the PN junction is taken below to exemplarily describe technical solutions in embodiments of the present disclosure. Cases where the photoelectric conversion unit includes the PIN junction all have technical principles similar to the technical principles of the example in which the photoelectric conversion unit includes the PN junction, which is not repeated in embodiments of the present disclosure.

It is to be noted that the preceding description exemplifies the case where each component structure in the driver circuit 12 in the driving substrate 10 and the photoelectric conversion unit 13 in the driving substrate 10 are disposed in different layers on a side of the base substrate 11. In embodiments of the present disclosure, the photoelectric conversion unit 13 and some component structures in the driver circuit 12 may be disposed in the same layer.

Figure 8:
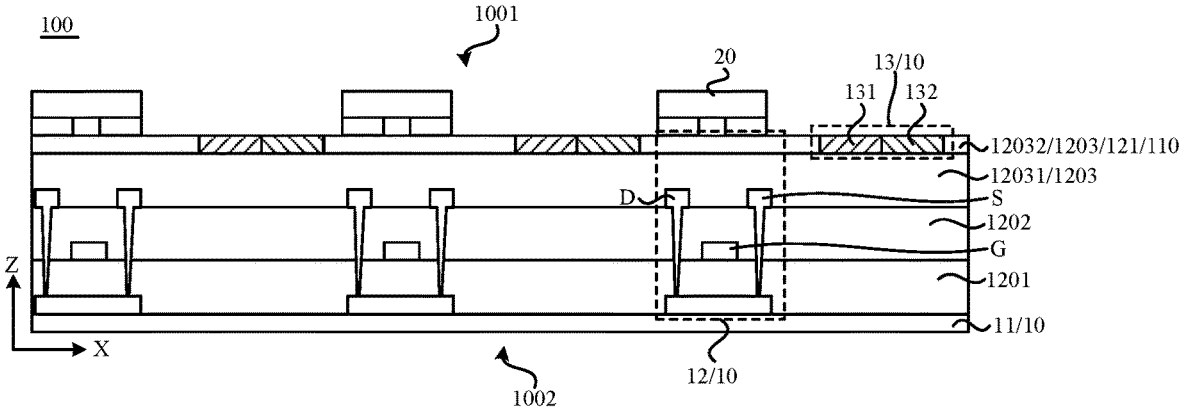
FIG. 8 is a diagram illustrating the layer structure of another light-emitting panel according to an embodiment of the present disclosure.

In an embodiment, FIG. 8 is a diagram illustrating the layer structure of another light-emitting panel according to an embodiment of the present disclosure. As shown in FIG. 8, the driver circuit 12 includes a first function structure 121. In this case, the driving substrate may further include a first function layer 110 located on a side of the base substrate 11 and including the first function structure 121, the first doped region 131, and the second doped region 132.

In an embodiment, an example is taken in which the driver circuit 12 includes a transistor. Function structures of the driver circuit 12 may include an active layer P of the transistor, a gate G of the transistor, a source S of the transistor, a drain D of the transistor, a gate insulating structure 1201 located between the active layer P and the gate G, an interlayer insulating structure 1202 located between the gate G and the source S and drain D, and a planarization structure 1203 located on a side of the source S and drain D facing away from the base substrate. The planarization structure 1203 may include an organic planarization structure 12031 and an inorganic planarization structure 12032 that are stacked. The inorganic planarization structure 12032 may include a silicon dioxide material or a silicon nitride material. In this case, the inorganic planarization structure 12032 may serve as the first function structure 121 of the driver circuit 12. Thus the first doped region 131 of the photoelectric conversion unit 13, the second doped region 132 of the photoelectric conversion unit 13, and the inorganic planarization structure 12032 can be each disposed in the first function layer 110 so that no additional layer is needed for disposing the first doped region 131 of the photoelectric conversion unit 13 and the second doped region 132 of the photoelectric conversion unit 13, making the light-emitting panel light and thin.

It is to be understood that in embodiments of the present disclosure, gate insulating structures 1201 of all the driver circuits 12 may be an integral structure; that is, the gate insulating structures 1201 of all the driver circuits are disposed in the same layer and connected to each other to form an entire-surface structure covering the base substrate 11. Interlayer insulating structures 1202 of all the driver circuits 12 may also be an integral structure and are connected to each other in the same layer to form an entire-surface structure covering the base substrate 11. Moreover, planarization structures 1203 of all the driver circuits 12 may also be an integral structure to form an entire-surface structure covering the base substrate 11.

Moreover, with continued reference to FIG. 8, an example is taken in which the first function structure 121 includes a silicon dioxide material. The specific manufacturing process of the first function layer is as follows: A silicon material layer is formed first; oxygen is injected in a position for forming the first function structure in the silicon material layer so that the injected oxygen can react with silicon in the silicon material layer to generate silicon dioxide with an insulating property, thereby forming the first function structure of the driver circuit 12; and n-type impurities and p-type impurities are doped in a position for forming the first doped region 131 and a position for forming the second doped region 132 respectively in the silicon material layer to form an n-type semiconductor and a p-type semiconductor respectively, thereby forming the first doped region 131 of the photoelectric conversion unit 13 and the second doped region 132 of the photoelectric conversion unit 13 respectively. With this arrangement, the first function structure 121, the first doped region 131, and the second doped region 132 that are in the driving substrate 10 may be manufactured in the production line, thereby preventing a change in production lines, due to manufacturing the driver circuit 12 and the photoelectric conversion unit 13 separately, from generating additional time costs and expenses, improving the production efficiency of the light-emitting panel 100, and being beneficial to the low cost of the light-emitting panel 100.

Figure 9:
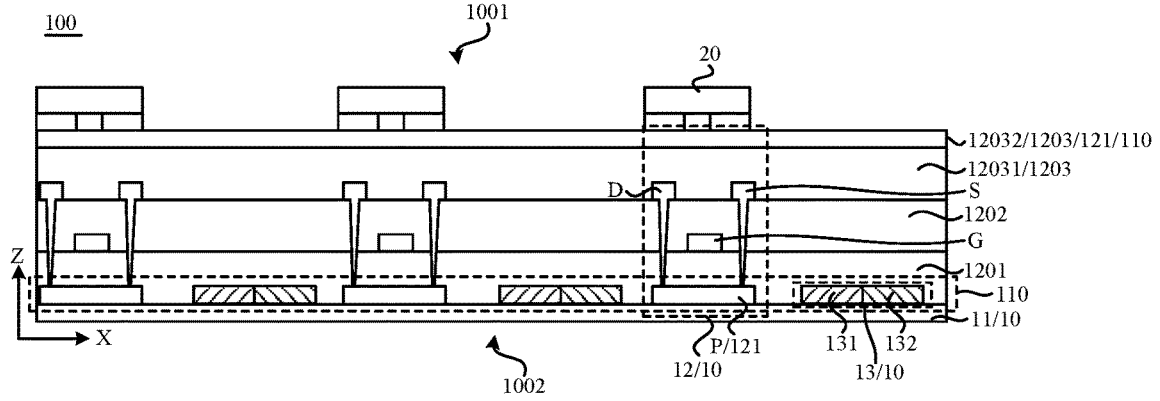
FIG. 9 is a diagram illustrating the layer structure of another light-emitting panel according to an embodiment of the present disclosure.

It is to be noted that FIG. 8 only exemplarily illustrates the case where the first function structure 121 is the inorganic planarization structure 12032. In embodiments of the present disclosure, the first function structure 121 may also be another structure in the driver circuit 12. In an embodiment, as shown in FIG. 9, the first function layer 121 may also be the active layer P of the transistor. The active layer P may be made of a low-temperature polycrystalline silicon material. In this case, the manufacturing process of the first function layer 110 is as follows: The silicon material layer is formed on a side of the base substrate 11 and patterned; and then different processing is performed on different positions of the silicon material layer to form the first function structure 121 of the driver circuit 12, the first doped region 131 of the photoelectric conversion unit 13, and the second doped region 132 of the photoelectric conversion unit 13 separately. In this case, to enable the first doped region 131 of the photoelectric conversion unit 13 and the second doped region 132 of the photoelectric conversion unit 13 to receive optical signals, each layer on a side of the first doped region 131 and the second doped region 132 facing away from the base substrate 11 may be arranged as a light-transmissive layer. With this arrangement, no special limitation to the first function structure 121 is made in embodiments of the present disclosure on the premise that the first function structure 121, the first doped region 131, and the second doped region 132 are disposed in the same layer. For ease of description, an example in which the first function structure is the inorganic planarization structure is taken below to exemplarily describe technical solutions in embodiments of the present disclosure.

Figure 10:
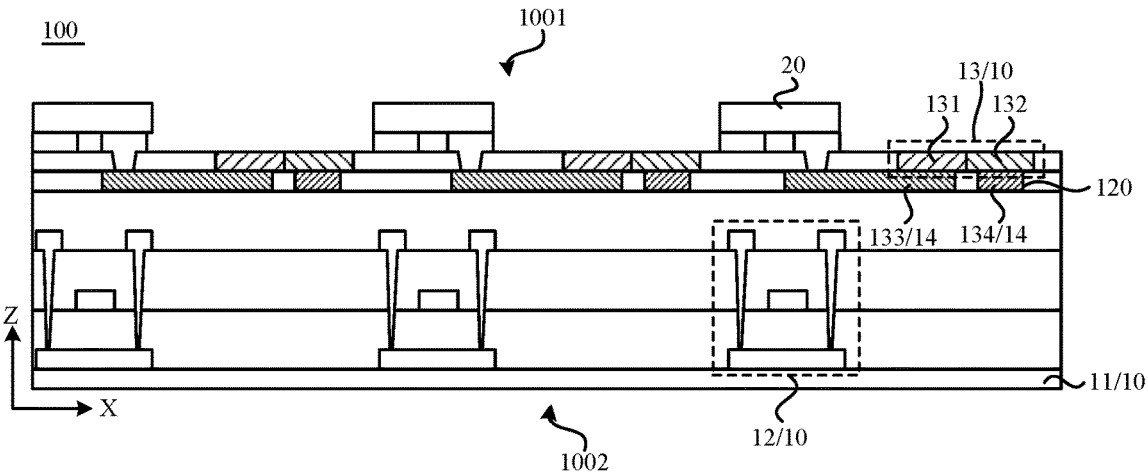
FIG. 10 is a diagram illustrating the layer structure of another light-emitting panel according to an embodiment of the present disclosure.

In an embodiment, FIG. 10 is a diagram illustrating the layer structure of another light-emitting panel according to an embodiment of the present disclosure. As shown in FIG. 10, the driving substrate 10 may further include a first conductive layer 120 located between the base substrate 11 and the photoelectric conversion unit 13 and including a plurality of first back electrodes 133 and a plurality of second back electrodes 134. In this case, the first doped region 131 is electrically connected to a second pole of the light-emitting element 20 through a first back electrode 133, and the second doped region 132 is electrically connected to a first pole of the light-emitting element 20 through a second back electrode 134. With this arrangement, an electrical signal converted by the photoelectric conversion unit 13 may be exported through the first back electrode 133 and the second back electrode 134 and supplied to the light-emitting element 20 so that the light-emitting element 20 can receive the additional electrical signal, which is beneficial to the low power consumption of the light-emitting panel and the high display brightness range of the light-emitting panel on the premise of improving the utilization of the light emitted by the light-emitting element 20.

It is to be understood that due to the limitation of cross-sectional positions of layers, the layer diagram shown in FIG. 10 only exemplarily illustrates the case where a second pole of each light-emitting element 20 is electrically connected to a first back electrode 133. A first pole of each light-emitting element 20 may also be electrically connected to a second back electrode 132. In this case, if the first doped region 131 and the second doped region 132 are an n-type doped region and a p-type doped region respectively, the first pole of the light-emitting element 20 and the second pole of the light-emitting element 20 are the anode and the cathode respectively. In this case, the photoelectric conversion unit 13 can form a current circuit with the light-emitting element 20 so that the electrical signal converted by the photoelectric conversion unit 13 can be supplied to the light-emitting element 20.

Figure 11:
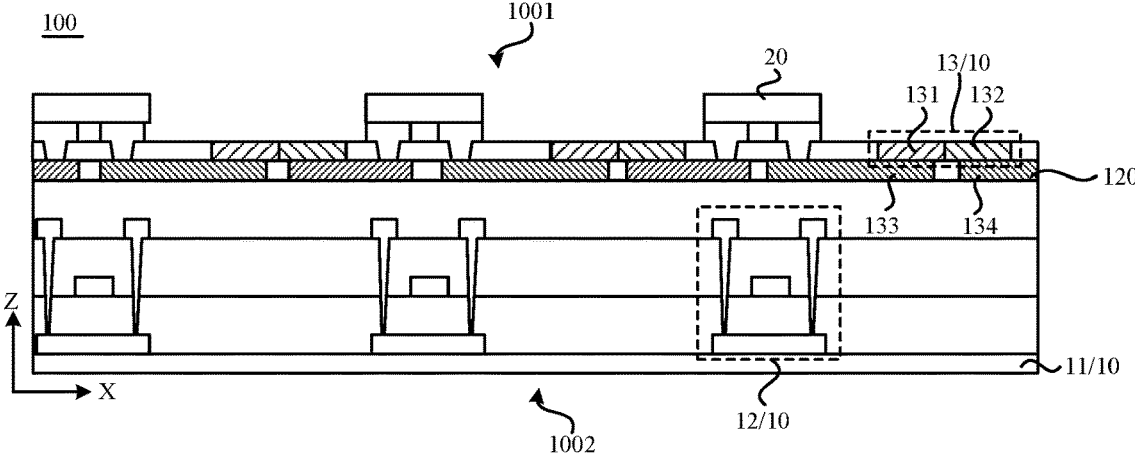

It is to be noted that in embodiments of the present disclosure, a first back electrode 133 and a second back electrode 134 that are electrically connected to the same light-emitting element 20 may be electrically connected to a first doped region 131 and a second doped region 132 respectively, with the first doped region 131 and the second doped region 132 belonging to the same photoelectric conversion unit 13. Alternatively, as shown in FIG. 11, a first back electrode 133 and a second back electrode 134 that are electrically connected to the same light-emitting element 20 may be electrically connected to a first doped region 131 and a second doped region 132 respectively, with the first doped region 131 and the second doped region 132 belonging to different photoelectric conversion units 13. No special limitations are made thereto in embodiments of the present disclosure on the premise that the electrical signal generated by the photoelectric conversion unit 13 can be supplied to the light-emitting element 20.

For ease of description, an example is taken below to exemplarily describe technical solutions in embodiments of the present disclosure. In the example, a first back electrode and a second back electrode that are electrically connected to the same light-emitting element may be electrically connected to a first doped region and a second doped region respectively, with the first doped region and the second doped region belonging to the same photoelectric conversion unit.

Figure 12:
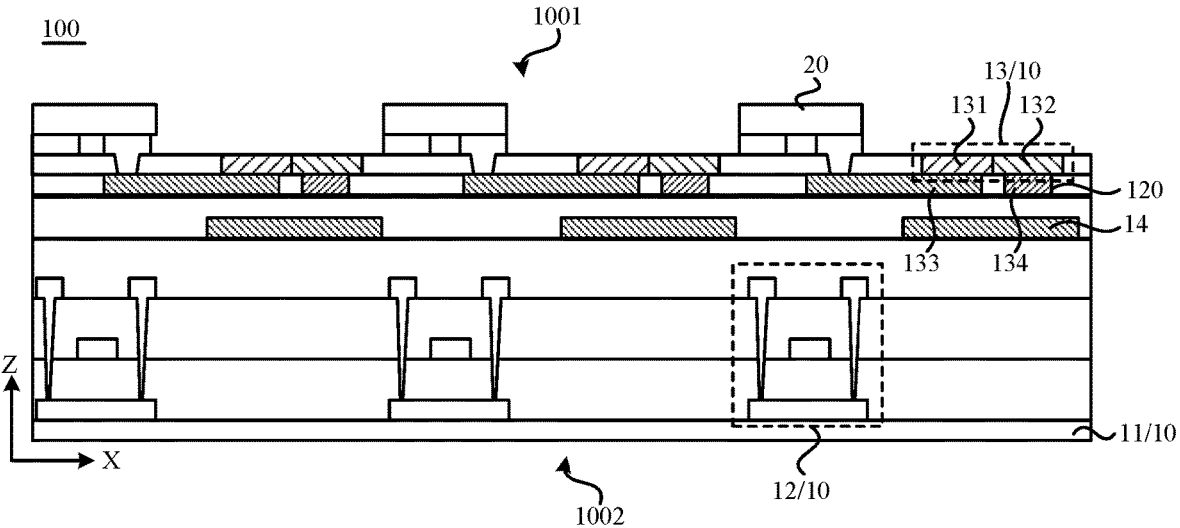
FIG. 12 is a diagram illustrating the layer structure of another light-emitting panel according to an embodiment of the present disclosure.

In an embodiment, FIG. 12 is a diagram illustrating the layer structure of another light-emitting panel according to an embodiment of the present disclosure. As shown in FIG. 12, the driving substrate 10 further includes a plurality of first reflective structures 14 located between the base substrate 11 and the photoelectric conversion unit 13. In a thickness direction Z of the light-emitting panel 100, a first reflective structure 14 overlaps the first doped region 131 and/or the second doped region 132.

In an embodiment, an example is taken in which in the thickness direction Z of the light-emitting panel 100, the first reflective structure 14 overlaps the first doped region 131 and the second doped region 132. The first reflective structure 14 can reflect the light transmitted through the first doped region 131 and the second doped region 132. In this case, after being reflected by the first reflective structure 14, the light propagated toward a back surface 1002 of the light-emitting panel 100 can be propagated toward the light emission surface 1001 of the light-emitting panel 100 again. Thus the light reflected by the first reflective structure 14 can be received by the photoelectric conversion unit 13 and/or emitted by the light emission surface 1001 of the light-emitting panel 100, preventing the light transmitted through the first doped region 131 and the second doped region 132 from being absorbed by other layers on a side of the photoelectric conversion unit facing the base substrate 11, or preventing the light from being transmitted through the base substrate 11 to reach the back surface 1002 of the light-emitting panel 100 and generate a waste of light. In this case, the arrangement of the first reflective structure 14 helps further improve light utilization, thereby being beneficial to the low power consumption of the light-emitting panel 100 and the high contrast ratio of the light-emitting panel 100.

In an embodiment, with continued reference to FIG. 10, each of the first back electrode 133 and the second back electrode 132 may also serve as the first reflective structure 14.

In an embodiment, the first conductive layer 120 may include a material with good conductivity and reflectivity, for example, silver or aluminum. In this case, since the first conductive layer 120 has a relatively high reflectance, the first back electrode 133 electrically connected to the first doped region 131 can reflect the light transmitted through the first doped region 131 and change the propagation direction of the light transmitted through the first doped region 131 so that the light reflected by the first back electrode 133 can be propagated toward the light emission surface 1001 of the light-emitting panel 100. The second back electrode 134 can reflect the light transmitted through the second doped region 132 so that the light reflected by the second back electrode 134 can be propagated toward the light emission surface 1001 of the light-emitting panel 100. With this arrangement, on the premise of improving light utilization, each of the first back electrode 133 and the second back electrode 132 serves as the first reflective structure 14, reducing the number of layers disposed in the light-emitting panel 100, simplifying the manufacturing process of the light-emitting panel 100, reducing the manufacturing cost of the light-emitting panel 100, and making the light-emitting panel 100 light and thin.

In an embodiment, only the first back electrode 133 may serve as the first reflective structure 14. In this case, a surface on a side of the first back electrode 133 facing the first doped region 131 may be coated with a coating with a relatively high reflectance so as to make the first back electrode 133 have a relatively high reflectance. Alternatively, only the second back electrode 134 may serve as the first reflective structure 14. In this case, a surface on a side of the second back electrode 134 facing the second doped region 132 may also be coated with a coating with a relatively high reflectance so as to make the second back electrode 134 have a relatively high reflectance. On the premise of improving light utilization and guaranteeing the light and thin feature of the light-emitting panel 100, no special limitation to whether the first back electrode 133 or the second back electrode 134 serves as the first reflective structure 14 is made in embodiments of the present disclosure.

Figure 13:
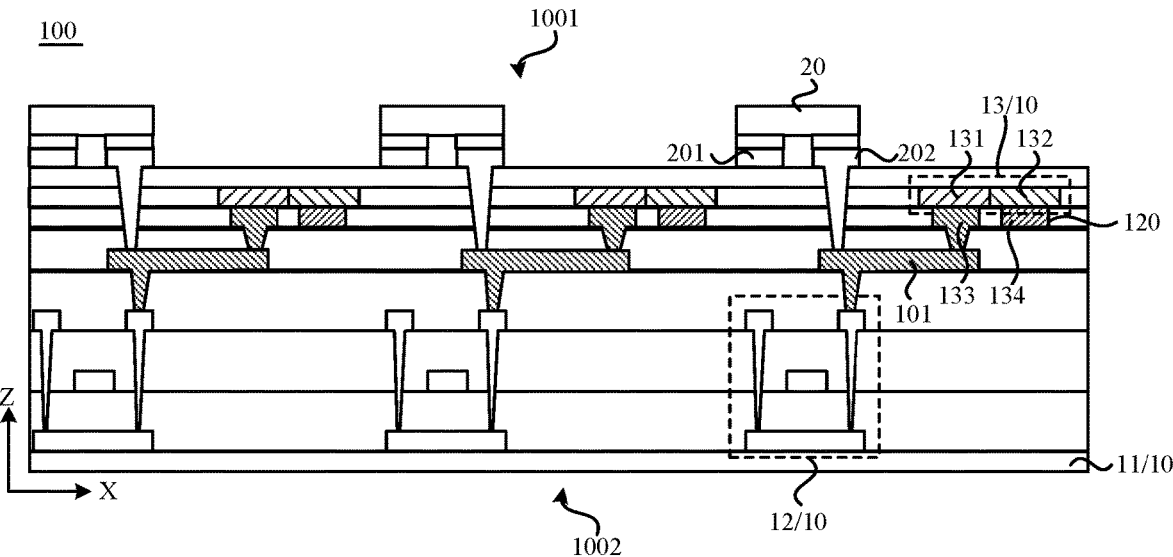
FIG. 13 is a diagram illustrating the layer structure of another light-emitting panel according to an embodiment of the present disclosure.

In an embodiment, FIG. 13 is a diagram illustrating the layer structure of another light-emitting panel according to an embodiment of the present disclosure. As shown in FIG. 13, the driving substrate 10 further includes a plurality of first bonding electrodes 201 and a plurality of second bonding electrodes 202. The first bonding electrodes 201 and the second bonding electrodes 202 are located on a side of the driver circuit 12 facing the light-emitting element 20. A first bonding electrode 201 is electrically connected to the first pole of the light-emitting element 20. A second bonding electrode 202 is electrically connected to the second pole of the light-emitting element 20. The first back electrode 133 is electrically connected to the second bonding electrode 202. The second back electrode 134 is electrically connected to the first bonding electrode 201. The driver circuit 12 is electrically connected to the first bonding electrode 201 and/or the second bonding electrode 202.

In an embodiment, when the light-emitting element 20 is a micro-light-emitting diode (for example, a micro LED or a mini LED), the light-emitting element 20 needs to be transferred to the driving substrate 10 in the manner of mass transfer. In this case, the first bonding electrode 201 and the second bonding electrode 202 that are used for bonding the light-emitting element 20 also need to be disposed on the driving substrate 10 so that the light-emitting element 20 is secured to the driving substrate 10 through the first bonding electrode 201 and the second bonding electrode 202 and is electrically connected to the photoelectric conversion unit 13 and the driver circuit 12 through the first bonding electrode 201 and the second bonding electrode 202.

In an embodiment, when the first pole of the light-emitting element 20 and the second pole of the light-emitting element 20 are the anode and the cathode respectively, the driver circuit 12 may be electrically connected to the anode of the light-emitting element 20 through the first bonding electrode 201. The cathode of the light-emitting element 20 may receive a negative power signal through the second bonding electrode 202. On the premise that the driver circuit 12 can drive the light-emitting element 20 to emit light, no special limitation to the connection relationship between the driver circuit 12 and the light-emitting element 20 is made in embodiments of the present disclosure.

It is to be understood that as shown in FIG. 13, when bonding electrodes (the first bonding electrode 201 and the second bonding electrode 202) and back electrodes (the first back electrode 133 and the second back electrode 134) are disposed in different layers, an example is taken in which a layer where the first bonding electrode 201 and the second bonding electrode 202 are located is located on a side of the first conductive layer 120 facing away from the base substrate 11. To implement the electrical connection between the first bonding electrode 201 and the second back electrode 134, the first back electrode 201 may be electrically connected to a connection line 101 through a via, and the connection line 101 is electrically connected to the second back electrode 134 through a via. Similarly, to implement the electrical connection between the second bonding electrode 202 and the first back electrode 133, the second bonding electrode 202 may be electrically connected to a connection line (not shown) through a via, and the connection line is electrically connected to the first back electrode 133 through a via. In this case, bonding electrodes (the first bonding electrode 201 and the second bonding electrode 202), back electrodes (the first back electrode 133 and the second back electrode 134), and connection lines (101 and 102) are disposed in different layers.

Figure 14:
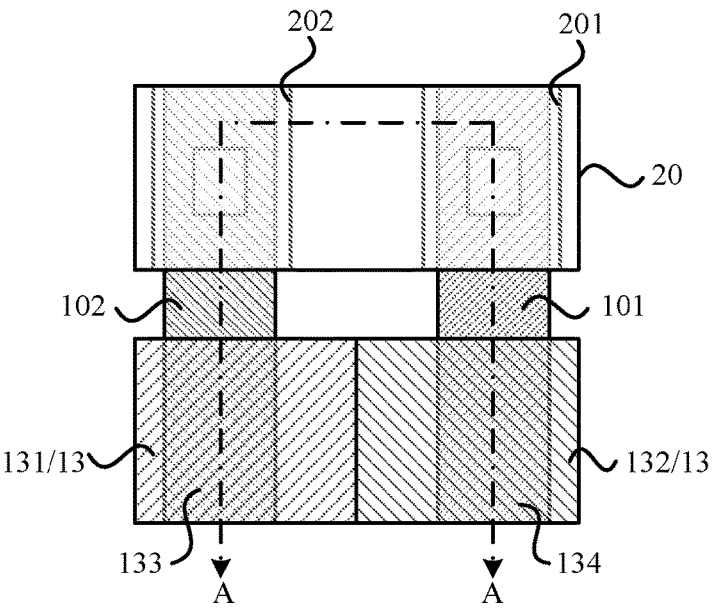
FIG. 14 is a top view illustrating a partial structure of a light-emitting panel according to an embodiment of the present disclosure.
Figure 15:
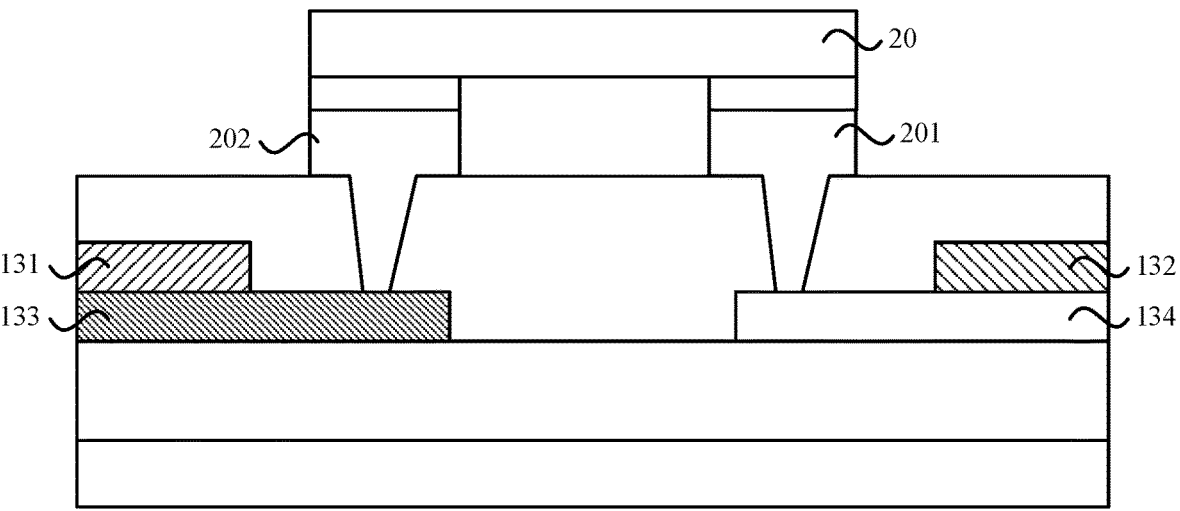
FIG. 15 is a section view taken along a section A-A of FIG. 14.

In an embodiment, FIG. 14 is a top view illustrating a partial structure of a light-emitting panel according to an embodiment of the present disclosure. FIG. 15 is a section view taken along a section A-A of FIG. 14. With combined reference to FIGS. 14 and 15, when the first bonding electrode 201 and the second bonding electrode 202 are disposed in a layer different from a layer for disposing the first back electrode 133 and the second back electrode 134, an example is taken in which the layer where the first bonding electrode 201 and the second bonding electrode 202 are located is on a side of the first conductive layer 120 facing away from the base substrate 11. To implement the electrical connection between the first bonding electrode 201 and the second back electrode 134, the first back electrode 201 may be electrically connected to the connection line 101 through a via and then is electrically connected to the second back electrode 134 through the connection line 101. Similarly, to implement the electrical connection between the second bonding electrode 202 and the first back electrode 133, the second bonding electrode 202 may be electrically connected to a connection line 102 in the first conductive layer 120 through a via and then is electrically connected to the first back electrode 133 through the connection line 102.

Figure 16:
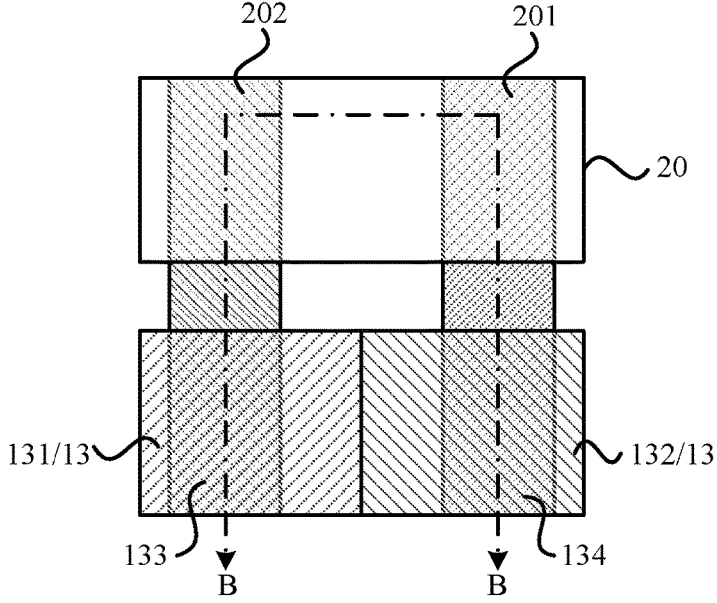
FIG. 16 is a top view illustrating a partial structure of another light-emitting panel according to an embodiment of the present disclosure.
Figure 17:
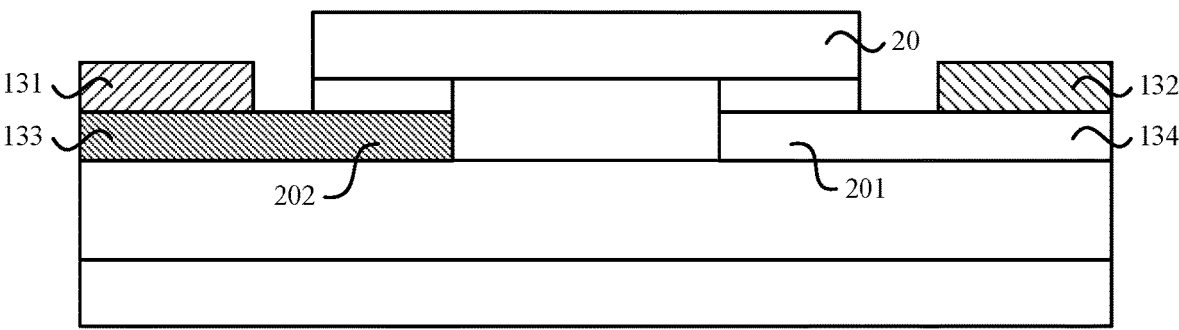
FIG. 17 is a section view taken along a section B-B' of FIG. 16.

In an embodiment, FIG. 16 is a top view illustrating a partial structure of another light-emitting panel according to an embodiment of the present disclosure. FIG. 17 is a section view taken along a section B-B' of FIG. 16. Referring to FIGS. 16 and 17, the first conductive layer 120 further includes the first bonding electrode 201 and the second bonding electrode 202. In this case, the first bonding electrode 201, the second bonding electrode 202, the first back electrode 133, and the second back electrode 134 may be manufactured in the same process using the same material, thereby simplifying the manufacturing process of the light-emitting panel and reducing the manufacturing cost of the light-emitting panel. Moreover, since the first bonding electrode 201, the second bonding electrode 202, the first back electrode 133, and the second back electrode 134 are located in the same layer, no additional layer is needed for disposing the first bonding electrode 201 and the second bonding electrode 202, reducing the number of layers in the light-emitting panel and thereby making the light-emitting panel light and thin.

In another embodiment, with continued reference to FIGS. 16 and 17, when the first bonding electrode 201, the second bonding electrode 202, the first back electrode 133, and the second back electrode 134 are located in the same layer, the first back electrode 133 and the second bonding electrode 202 that are electrically connected to each other may be an integral structure, and the second back electrode 134 and the first bonding electrode 201 that are electrically connected to each other may be an integral structure. In this case, when the first back electrode 133 and the second bonding electrode 202 are manufactured using the process of mask etching, different etching patterns are not needed to be arranged on a mask. Similarly, when the second back electrode 134 and the first bonding electrode 201 are manufactured using the process of mask etching, different etching patterns are not needed to be arranged on a mask. Accordingly, the design of a mask can be simplified, shortening the design cycle of the mask, reducing the cost of the mask, thereby reducing the manufacturing cost of the light-emitting panel, and simplifying the design of the light-emitting panel.

It is to be understood that on the premise that the driver circuit 12 supplies a drive signal to the light-emitting element 20 through the first bonding electrode 201, the specific structure of the driver circuit 12 provided in embodiments of the present disclosure may be designed according to needs. For example, the driver circuit 12 may be a 2T1C circuit as shown in FIG. 3. In this case, the photoelectric conversion unit 13 is directly connected to the light-emitting element 20 in series. In another embodiment, the driver circuit 12 may also be another structure.

Figure 18:
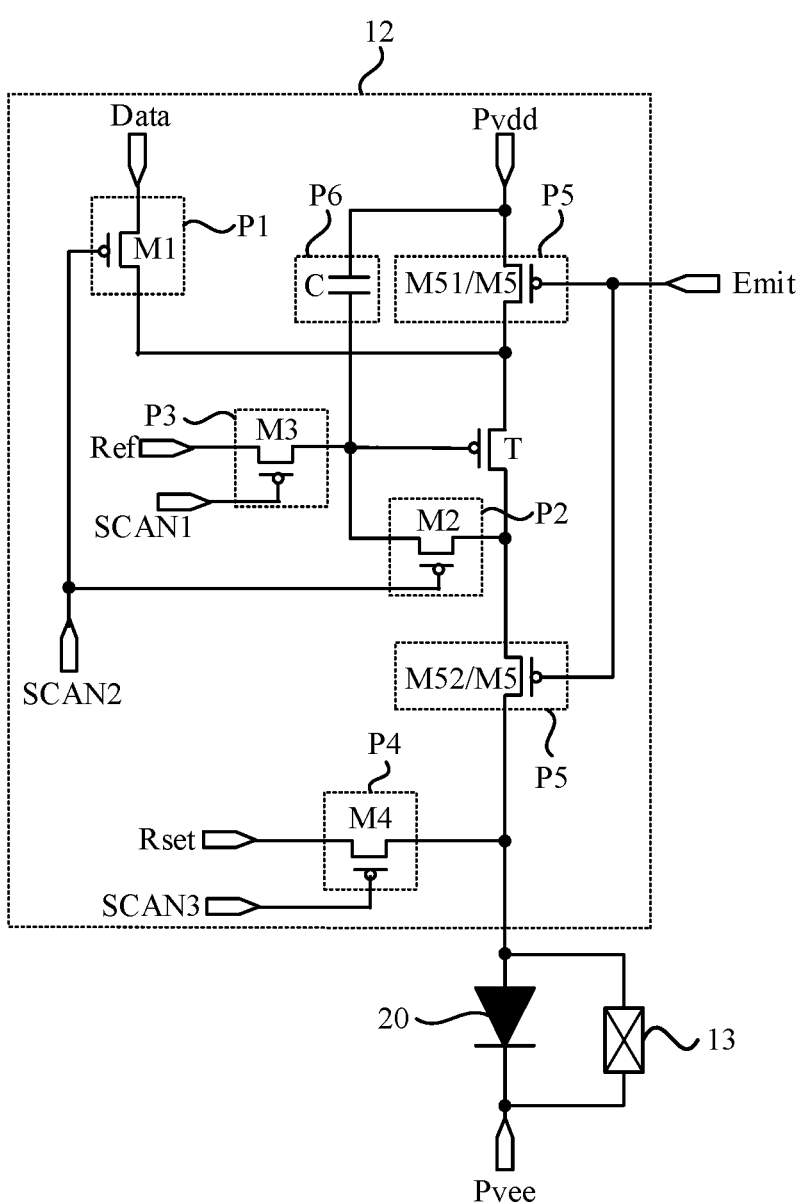
FIG. 18 is a diagram illustrating the structure of another driver circuit according to an embodiment of the present disclosure.

In an embodiment, FIG. 18 is a diagram illustrating the structure of another driver circuit according to an embodiment of the present disclosure. As shown in FIG. 18, when the light-emitting element 20 is a current-driven element, the driver circuit 12 includes a data write module P1, a threshold compensation module P2, an initialization module P3, a reset module P4, a light emission control module P5, a storage module P6, a drive transistor T, a data signal terminal Data, an initialization signal terminal Ref, a reset signal terminal Rset, a positive power terminal Pvdd, and a negative power terminal Pvee. The data write module P1 may be electrically connected to a first pole of the drive transistor T and the data signal terminal Data. The threshold compensation module P2 may be electrically connected to a second pole of the drive transistor T and a gate of the drive transistor T. The initialization module P3 may be electrically connected to the gate of the drive transistor T and the initialization signal terminal Ref. The reset module P4 may be electrically connected to the first pole of the light-emitting element 20 and the reset signal terminal Rset. The light emission control module P5, the drive transistor T, and the light-emitting element 20 are connected in series between the positive power terminal Pvdd and the negative power terminal Pvee. The storage module P6 is electrically connected between the positive power terminal Pvdd and the gate of the drive transistor T. In this case, in the initialization stage, the initialization module P3 may control an initialization signal Vref of the initialization signal terminal Ref to be written to the gate of the drive transistor T so as to initialize the gate of the drive transistor T and the storage module P6. In the data write stage, the data write module P1 may control a data signal Vdata of the data signal terminal Data to be written to the gate of the drive transistor T.

Moreover, the threshold compensation module P2 may compensate a threshold voltage Vth of the drive transistor T to the gate of the driving transistor T. Thus a gate potential of the drive transistor T is Vdata+Vth at the end of the data write stage. The storage module P6 may store the gate potential so as to maintain light emission requirements of the light-emitting element 20 in the subsequent light emission stage. In the light emission stage, the light emission control module P5 controls a current path to be formed from the positive power terminal Pvdd to the negative power terminal Pvee. Thus a drive current generated by a difference between the gate potential and a positive power signal PVDD of the positive power terminal Pvdd is taken as a drive signal and supplied to the light-emitting element 20 by the drive transistor T so as to drive the light-emitting element 20 to emit light. Before the light emission stage, the reset module P4 may control a reset signal Vrset of the reset signal terminal Rset to be transmitted to the first pole of the light-emitting element 20 so as to reset the first pole of the light-emitting element 20.

In an embodiment, the initialization module P3 may include an initialization transistor M3. In this case, the driver circuit 12 may further include a first scan signal terminal SCAN1. A first pole of the initialization transistor M3 is electrically connected to the initialization signal terminal Ref. A second pole of the initialization transistor M3 is electrically connected to the gate of the drive transistor T. A gate of the initialization transistor M3 is electrically connected to the first scan signal terminal SCAN1. The initialization transistor M3 may turn on or off under the control of a first scan signal Scant of the first scan signal terminal SCAN1. Thus when the first scan signal Scant of the first scan signal terminal SCAN1 controls the initialization transistor M3 to turn on, the initialization signal Vref of the initialization signal terminal Ref can be written to the gate of the drive transistor T.

In an embodiment, the data write module P1 may include a data write transistor M1, and the threshold compensation module P2 may include a threshold compensation transistor M2. In this case, the driver circuit 12 may further include a second scan signal terminal SCAN2. A first pole of the data write transistor M1 is electrically connected to the data signal terminal Data. A second pole of the data write transistor M1 is electrically connected to the first pole of the drive transistor T. A first pole of the threshold compensation transistor M2 is electrically connected to the second pole of the drive transistor T. A second pole of the threshold compensation transistor M2 is electrically connected to the gate of the drive transistor T. A gate of the data write transistor M1 and a gate of the threshold compensation transistor M2 are each electrically connected to the second scan signal terminal SCAN2. The data write transistor M1 and the threshold compensation transistor M2 may turn on or off under the control of a second scan signal Scan2 of the second scan signal terminal SCAN2. Thus when the second scan signal Scan2 of the second scan signal terminal SCAN2 controls the data write transistor M1 and the threshold compensation transistor M2 to turn on, the data signal Vdata of the data signal terminal Data and the threshold voltage Vth of the drive transistor T can be written to the gate of the drive transistor T.

In an embodiment, the light emission control module P5 may include two light emission control transistors M5, that is, a first light emission control transistor M51 and a second light emission control transistor M52. In this case, the driver circuit 12 may further include a light emission control terminal Emit. A first pole of the first light emission control transistor M51 is electrically connected to the positive power terminal Pvdd. A second pole of the first light emission control transistor M51 is electrically connected to the first pole of the drive transistor T. A first pole of the second light emission control transistor M52 is electrically connected to the second pole of the drive transistor T. A second pole of the second light emission control transistor M52 is electrically connected to the first pole of the light-emitting element 20. A gate of the first light emission control transistor M51 and a gate of the second light emission control transistor M52 are each electrically connected to the light emission control terminal Emit. The first light emission control transistor M51 and the second light emission control transistor M52 may turn on or off under the control of a light emission control signal EMIT of the light emission control terminal Emit. Thus when the light emission control signal EMIT of the light emission control terminal Emit controls the first light emission control transistor M51 and the second light emission control transistor M52 to turn on, the current path is formed between the positive power terminal Pvdd and the negative power terminal Pvee, helping the drive transistor T to supply the drive signal to the light-emitting element 20.

In an embodiment, the reset module P4 may include a reset transistor M4. In this case, the driver circuit 12 may further include a third scan signal terminal SCAN3. A first pole of the reset transistor M4 is electrically connected to the reset signal terminal Rset. A second pole of the reset transistor M4 is electrically connected to the first pole of the light-emitting element 20. A gate of the reset transistor M4 is electrically connected to the third scan signal terminal SCAN3. The reset transistor M4 may turn on or off under the control of a third scan signal Scan3 of the third scan signal terminal SCAN3. Thus when the third scan signal Scan3 of the third scan signal terminal SCAN3 controls the reset transistor M4 to turn on, the reset signal Vrset of the reset signal terminal Rset is written to the first pole of the light-emitting element 20.

In an embodiment, the storage module P6 may include a storage capacitor C. A first plate of the storage capacitor C may be electrically connected to the positive power terminal Pvdd. A second plate of the storage capacitor C may be electrically connected to the gate of the drive transistor T. The storage capacitor C can store the gate potential of the drive transistor T.

It is to be understood that with continued reference to FIG. 14, when the driver circuit is a typical 7T1C (seven-transistor one-capacitor) circuit, the photoelectric conversion unit 13 is also directly connected to the light-emitting element 20 in series so that both an electrical signal converted by the photoelectric conversion unit 13 and a drive signal supplied by the driver circuit can be supplied to the light-emitting element 20. Moreover, since the photoelectric conversion unit 13 is directly electrically connected to the light-emitting element 20, the electrical signal converted by the photoelectric conversion unit 13 can be directly supplied to the light-emitting element 20, thereby reducing the loss of the electrical signal converted by the photoelectric conversion unit 13 in the transmission process.

Figure 19:
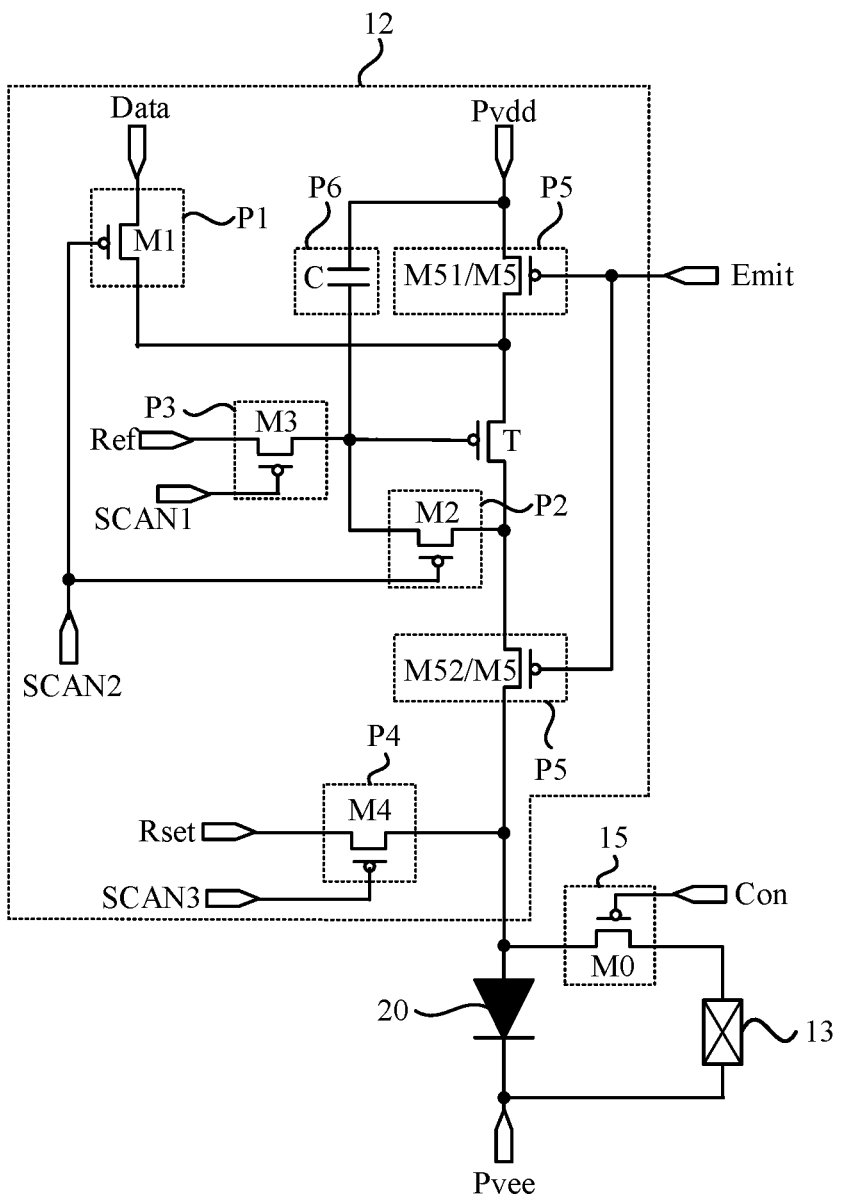
FIG. 19 is a diagram illustrating the structure of another driver circuit according to an embodiment of the present disclosure.
Figure 20:
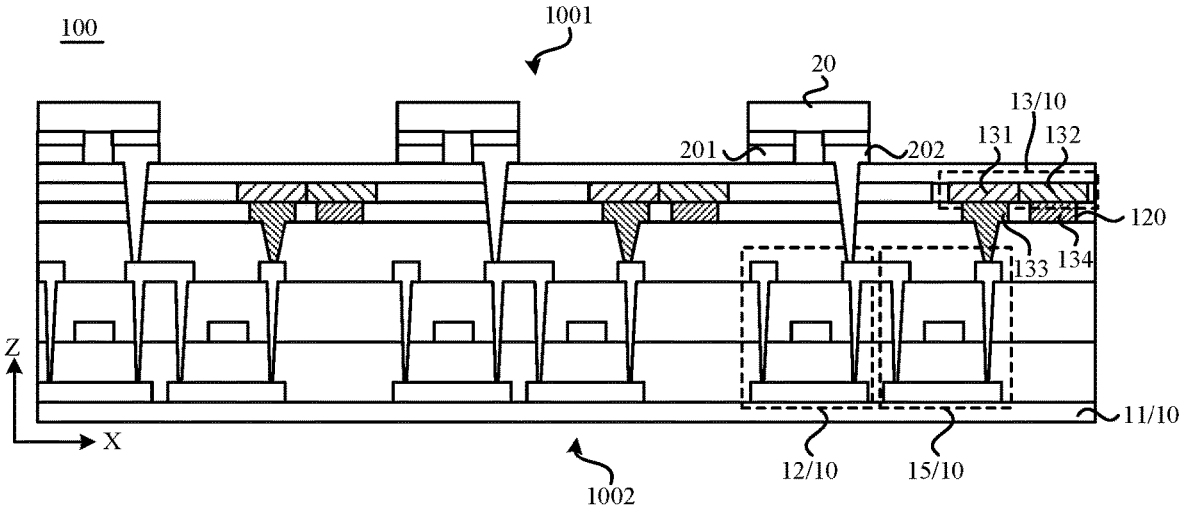
FIG. 20 is a diagram illustrating the layer structure of another light-emitting panel according to an embodiment of the present disclosure.

In other embodiments of the present disclosure, FIG. 19 is a diagram illustrating the structure of another driver circuit according to an embodiment of the present disclosure. FIG. 20 is a diagram illustrating the layer structure of another light-emitting panel according to an embodiment of the present disclosure. With combined reference to FIGS. 19 and 20, the driving substrate may further include a plurality of switch circuits 15 located on a side of the base substrate 11. The photoelectric conversion unit 13 is electrically connected to the light-emitting element 20 through a switch circuit 15. The switch circuit 15 is configured to control the electrical signal converted by the photoelectric conversion unit 13 to be supplied to the light-emitting element 20 when the light-emitting element 20 emits light.

In an embodiment, when receiving an optical signal with sufficiently high energy, the photoelectric conversion unit 13 performs photoelectric conversion. If the converted electrical signal is supplied to the light-emitting element 20 before the light-emitting element 20 is controlled to emit light (for example, before the data write stage and/or the initialization stage), the light-emitting element 20 may emit light in a light non-emission stage (for example, the data write stage and/or the initialization stage) and thereby affect the display and light emission effect of the light-emitting panel 100. Accordingly, the switch circuit 15 is disposed between the photoelectric conversion unit 13 and the light-emitting element 20. Moreover, the switch circuit 15 turns on only in the light emission stage of the light-emitting element 20 and turns off in any light non-emission stage to prevent the light-emitting element 20 from emitting light due to receiving the electrical signal supplied by the photoelectric conversion unit 13, thereby improving the display and light emission accuracy of the light-emitting panel 100 and improving the display quality of the light-emitting panel 100.

In an embodiment, with continued reference to FIGS. 19 and 20, when the driver circuit 12 includes at least one light emission control transistor M5 connected in series between the light-emitting element 20 and the drive transistor T, the at least one light emission control transistor M5 may turn on or off under the control of the light emission control signal EMIT of the light emission control terminal Emit. Moreover, when the at least one light emission control transistor M5 is in the on state, the drive current generated by the drive transistor T can be transmitted through the at least one light emission control transistor M5 to the light-emitting element 20 so as to drive the light-emitting element to emit light. The switch circuit 15 may include a switch transistor M0. The switch transistor M0 is connected in series between the photoelectric conversion unit 13 and the light-emitting element 20. The switch transistor M0 may turn on or off under the control of a switch control signal CON of a switch control terminal Con. Moreover, when turning on, the switch transistor M0 can supply the electrical signal converted by the photoelectric conversion unit 13 to the light-emitting element 20.

At least a partial structure of the switch transistor M0 and at least a partial structure of a light emission control transistor M5 are disposed in the same layer. In an embodiment, an active layer of the switch transistor M0 and an active layer of the light emission control transistor M5 may be disposed in the same layer. A gate of the switch transistor M0 and a gate of the light emission control transistor M5 may be disposed in the same layer. A source/drain of the switch transistor M0 and a source/drain of the light emission control transistor M5 may also be disposed in the same layer. With this arrangement, the switch transistor M0 and the light emission control transistor M5 can be manufactured in the same process, thereby simplifying the manufacturing process of the light-emitting panel 100 and reducing the cost of the light-emitting panel 100. Moreover, since each structure of the switch transistor M0 and each structure of the light emission control transistor M5 are disposed in the same layer, no additional layer is needed for disposing the switch transistor M0, making the light-emitting panel 100 light and thin.

It is to be understood that the light emission control transistor M5 can control the time when the drive transistor T supplies the drive signal to the light-emitting element 20. That is, the light emission control transistor M5 can control the light emission time of the light-emitting element 20. The switch transistor M0 is used for controlling the electrical signal converted by the photoelectric conversion unit 13 to be supplied to the light-emitting element 20 when the light-emitting element 20 emits light. Therefore, the switch transistor M0 and the light emission control transistor M5 may turn on simultaneously; alternatively, the turning-on period of the switch transistor M0 may be within the turning-on period of the light emission control transistor M5.

Figure 21:
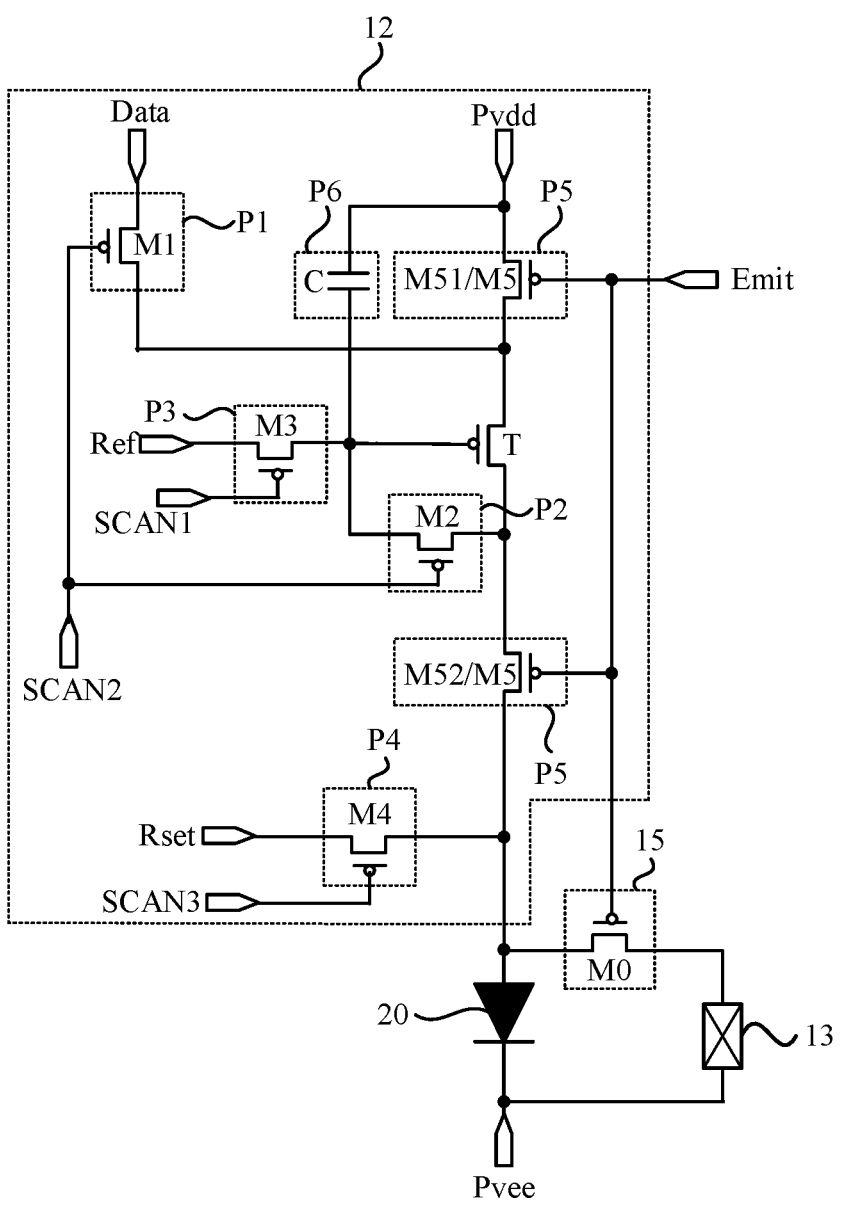
FIG. 21 is a diagram illustrating the structure of another driver circuit according to an embodiment of the present disclosure.

In an embodiment, FIG. 21 is a diagram illustrating the structure of another driver circuit according to an embodiment of the present disclosure. As shown in FIG. 21, when the switch transistor M0 and the light emission control transistor M5 turn on simultaneously, the gate of the switch transistor M0 may be electrically connected to the gate of the light emission control transistor M5 so that the light emission control signal EMIT received by the gate of the light emission control transistor M5 can serve as the switch control signal of the switch transistor M0, reducing the number of control signals supplied to the driver circuit 12 and the switch circuit 15 that are in the driving substrate. Thus no corresponding control signal generation circuit is needed for generating the light emission control signal EMIT and the switch control signal respectively, reducing a space occupied by the control signal generation circuits. Moreover, since the control signal generation circuits are usually located in a non-display region of the light-emitting panel, the reduction of the space occupied by the control signal generation circuits is beneficial to a narrow bezel of the light-emitting panel.

Figure 22:
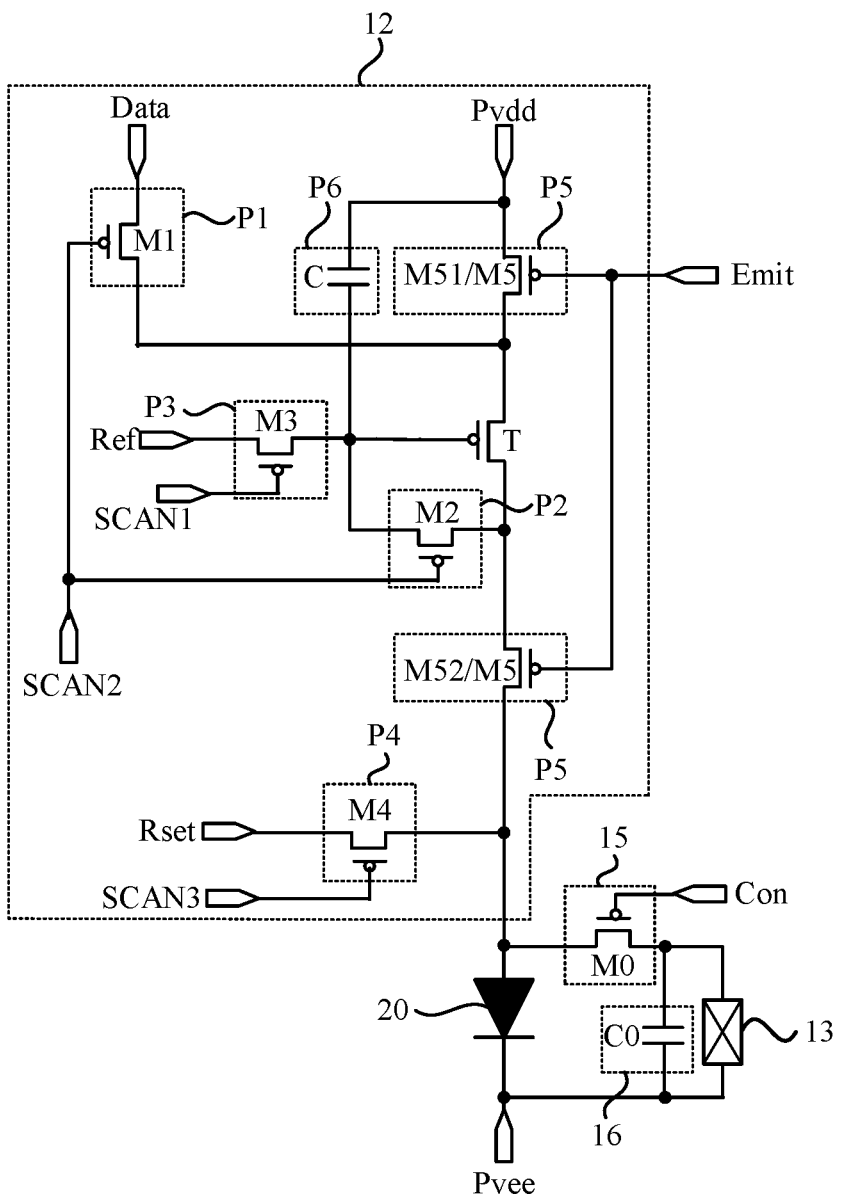
FIG. 22 is a diagram illustrating the structure of another driver circuit according to an embodiment of the present disclosure.
Figure 23:
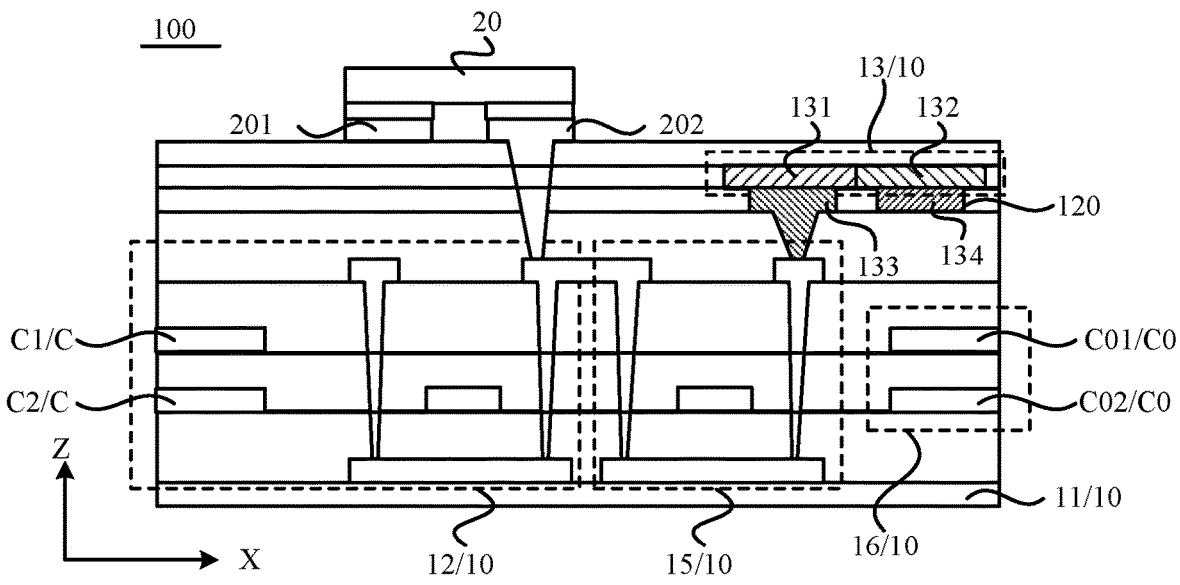
FIG. 23 is a diagram illustrating the layer structure of another light-emitting panel according to an embodiment of the present disclosure.

In an embodiment, FIG. 22 is a diagram illustrating the structure of another driver circuit according to an embodiment of the present disclosure. FIG. 23 is a diagram illustrating the layer structure of another light-emitting panel according to an embodiment of the present disclosure. With combined reference to FIGS. 22 and 23, the driving substrate further includes a plurality of energy storage circuits 16 located on a side of the base substrate 11. An energy storage circuit 16 is electrically connected to the photoelectric conversion unit 13. The energy storage circuit 16 is configured to store at least part of electrical signals converted by the photoelectric conversion unit 13. With this arrangement, redundant electrical signals converted by the photoelectric conversion unit 13 are stored. Thus when the light-emitting element 20 needs higher display brightness, this part of electrical signals can be released, thereby improving the photoelectric conversion efficiency of the photoelectric conversion unit 13 and improving the controllability of electrical signals converted by the photoelectric conversion unit 13.

In an embodiment, with continued reference to FIGS. 22 and 23, the energy storage circuit 16 may include an energy storage capacitor C0. A first plate C01 of the energy storage capacitor C0 may be electrically connected to the first doped region 131 of the photoelectric conversion unit 13. A second plate C02 of the energy storage capacitor C0 may be electrically connected to the second doped region 132 of the photoelectric conversion unit 13. In this case, the driver circuit 12 may include at least the storage capacitor C. The storage capacitor C can store the gate potential of the drive transistor T electrically connected to the storage capacitor C so as to maintain the gate potential of the drive transistor T in the light emission stage, enabling the drive transistor T to generate a stable drive current.

At least a partial structure of the energy storage capacitor C0 and at least a partial structure of the storage capacitor C are disposed in the same layer. In an embodiment, the first plate C01 of the energy storage capacitor C0 and the first plate C1 of the storage capacitor C are disposed in the same layer. The second plate C02 of the energy storage capacitor C0 and the second plate C2 of the storage capacitor C are disposed in the same layer. With this arrangement, no additional layer is needed for disposing the energy storage capacitor C0, simplifying the structure of the light-emitting panel 100 and the manufacturing process of the light-emitting panel 100 and making the light-emitting panel 100 light and thin.

Additionally, when the driver circuit 12 includes the light emission control transistor M5, the second plate C02 of the energy storage capacitor C0 and the second plate C2 of the storage capacitor C may also be disposed in the same layer as the light emission control transistor M5, further simplifying the structure of the light-emitting panel 100 and the manufacturing process of the light-emitting panel 100.

It is to be understood that the driving substrate may include only the switch circuit or the energy storage circuit or may include both the switch circuit and the energy storage circuit, which may be designed according to actual needs. No special limitation is made thereto in embodiments of the present disclosure.

In the embodiments below, for ease of description and simplification of the drawings, structures of the driver circuit, the switch circuit, and the energy storage circuit are omitted in the drawings. However, it is to be understood by those skilled in the art that the addition of at least one structure of the driver circuit, the switch circuit, and the energy storage circuit does not affect the beneficial effects of the embodiments below.

Figure 24:
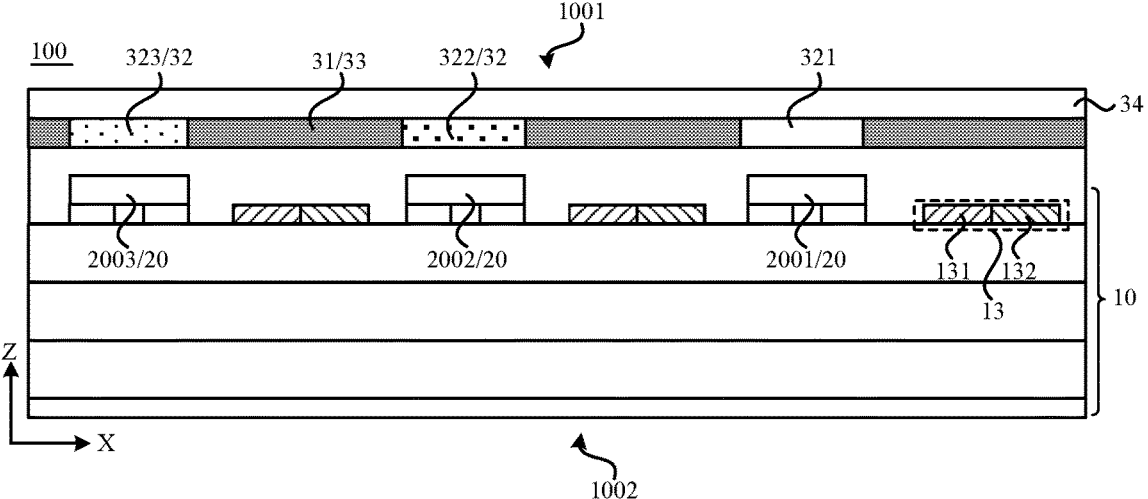
FIG. 24 is a diagram illustrating the layer structure of another light-emitting panel according to an embodiment of the present disclosure.

In an embodiment, FIG. 24 is a diagram illustrating the layer structure of another light-emitting panel according to an embodiment of the present disclosure. As shown in FIG. 24, on the basis of the preceding embodiments, the light-emitting panel 100 may further include a plurality of light-shielding structures 31 and color conversion structures 32. The light-shielding structures 31 are located on a side of the light-emitting element 20 facing away from the driving substrate 10. A color conversion structure 32 is located between two adjacent light-shielding structures 31. In the thickness direction Z of the light-emitting panel 100, the color conversion structure 32 overlaps the light-emitting element 20. A light-shielding structure 31 overlaps the photoelectric conversion unit 13.

In an embodiment, the arrangement in which the color conversion structure 32 is disposed on a side of the light-emitting element 20 facing away from the driving substrate 10 enables the light emitted by the light-emitting element 20 and passing through the color conversion structure 32 to be converted into the light of another color, thereby implementing the color display of the light-emitting panel 100 and enabling the light-emitting panel 100 to have a wide color gamut. The arrangement in which the color conversion structure 32 is located between two adjacent light-shielding structures 31 prevents the light converted by adjacent color conversion structures 32 from generating crosstalk, improving the display and light emission accuracy of the light-emitting panel 100.

The color conversion structure 32 may include a filtering material with the function of filtering. For example, when the light emission color of the light-emitting element 20 is white, the color conversion structure 32 can transmit the light of a specific color and prevent the light of another color from being transmitted through, implementing the color display of the light-emitting panel 100. Alternatively, when two or more adjacent light-emitting elements 20 have different light emission colors from each other, the color conversion structure 32 overlapping one light-emitting element 20 can transmit only the light emitted by the light-emitting element 20 and prevent the light emitted by the other light-emitting element whose light emission color is different from the light emission color of the light-emitting element 20, thereby preventing the light emitted by light-emitting elements 20 of different light emission colors from generating crosstalk and affecting the display accuracy of the light-emitting panel 100.

In another embodiment, the material of the color conversion structure 32 may include a quantum dot material. Color conversion structures including quantum dot materials of different colors are disposed on a side of different light-emitting elements 20 facing away from the driving substrate 10. With this arrangement, when the light emitted by a light-emitting element 20 excites a quantum dot material of a corresponding color, the quantum dot material can generate photons of the corresponding color so that the light emitted by the light-emitting element 20 is converted into the light of the corresponding color. In this case, light-emitting elements 20 of corresponding light emission colors may be arranged selectively according to wavelengths of the excitation light needed by quantum dots of different colors. In an optional embodiment, light emission colors of all the light-emitting elements 20 may be one of blue, red, or green.

In an embodiment, with continued reference to FIG. 24, when the light emission color of the light-emitting element 20 is a first color, the color conversion structures 32 include a second color conversion structure 322 and a third color conversion structure 323. The second color conversion structure 322 is configured to convert the light of the first color emitted by the light-emitting element 20 into a second color. The third color conversion structure 323 is configured to convert the light of the first color emitted by the light-emitting element 20 into a third color. Three adjacent light-emitting elements 20 are a first light-emitting element 2001, a second light-emitting element 2002, and a third light-emitting element 2003. In the thickness direction of the light-emitting panel 100, the first light-emitting element 2001 overlaps no color conversion structure 32, the second light-emitting element 2002 overlaps the second color conversion structure 322, and the third light-emitting element 2003 overlaps the third color conversion structure 323.

Exemplary, an example is taken in which the first color, the second color, and the third color are red, green, and blue respectively. When the light emission color of each light-emitting element 20 is blue, the arrangement in which the first light-emitting element 2001 overlaps no color conversion structure 32 enables the blue light emitted by the first light-emitting element 2001 to reach the display surface 1001 of the light-emitting panel 100 without being transmitted through any color conversion structure 32. The arrangement in which the second light-emitting element 2002 overlaps the second color conversion structure 322 enables the blue light emitted by the second light-emitting element 2002 to be converted into red light after being transmitted through the second color conversion structure 322. The arrangement in which the third light-emitting element 2003 overlaps the third color conversion structure 323 enables the blue light emitted by the third light-emitting element 2003 to be converted into green light after being transmitted through the third color conversion structure 323. In this case, the color display of the light-emitting panel 100 can be implemented although the light emission color of each light-emitting element 20 is the same.

In an embodiment, with continued reference to FIG. 24, when the first light-emitting element 2001 overlaps no color conversion structure, the light-emitting panel 100 may further include a light-transmitting structure 321 located between two adjacent light-shielding structures 31. In the thickness direction of the light-emitting panel 100, the first light-emitting element 2001 overlaps the light-transmitting structure 321. In this case, a region between two adjacent light-shielding structures 31 overlapping the first light-emitting element 2001 can be filled by the light-transmitting structure 321 to ensure that a layer where a light-shielding structure 31 and a color conversion structure 32 are located has a flat surface.

Figure 25:
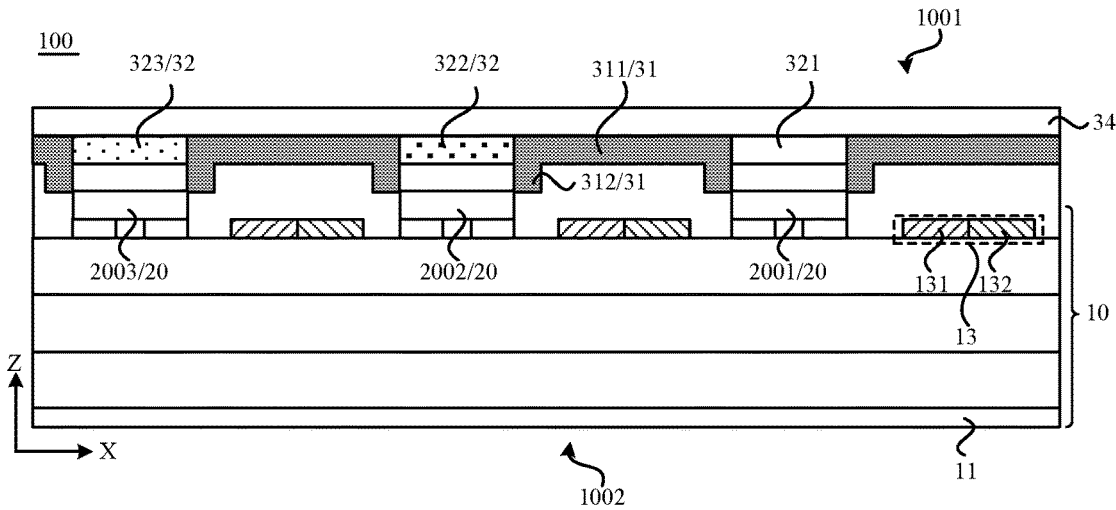
FIG. 25 is a diagram illustrating the layer structure of another light-emitting panel according to an embodiment of the present disclosure.

In an embodiment, FIG. 25 is a diagram illustrating the layer structure of another light-emitting panel according to an embodiment of the present disclosure. As shown in FIG. 25, the light-shielding structure 31 includes a first light-shielding portion 311 and a second light-shielding portion 312 that are connected to each other. The second light-shielding portion 312 is located on a side of the first light-shielding portion 311 facing the light-emitting element 20. In the thickness direction Z of the light-emitting panel 100, the first light-shielding portion 311 overlaps the photoelectric conversion unit 13. In the thickness direction Z of the light-emitting panel 100, the second light-shielding portion 311 is located between the photoelectric conversion unit 13 and the color conversion structure 32. In the first direction X, the second light-shielding portion 312 is located between the photoelectric conversion unit 13 and the color conversion structure 32.

In an embodiment, the arrangement in which the photoelectric conversion unit 13 is located between a gap between two adjacent light-emitting elements 20 enables the photoelectric conversion unit 13 to receive the light emitted by surrounding light-emitting elements 20. In the case where all the light-emitting elements 20 have the same light emission color, although no light-blocking structure is disposed between the light-emitting elements 20, the light emitted by two adjacent light-emitting elements 20 may not generate color crosstalk. However, after being transmitted through the color conversion structure 32 and entering the light-emitting panel, the color of ambient light is also converted by the color conversion structure 32. In an embodiment, after being transmitted through the second color conversion structure 322, the light entering the light-emitting panel 100 is converted into the light of the second color. After being transmitted through the third color conversion structure 323, the light entering the light-emitting panel 100 is converted into the light of the third color. When propagated to a region where the second light-emitting element 2002 is located, the light of the third color may affect the display chroma and brightness of the second light-emitting element 2002. Moreover/alternatively, when propagated to a region where the third light-emitting element 2003 is located, the light of the second color may affect the display chroma and brightness of the third light-emitting element 2003. In this case, the arrangement of the second light-shielding portion 312 can prevent the light of the third color from being propagated to the region where the second light-emitting element 2002 is located. Moreover, the arrangement of the second light-shielding portion 312 can prevent the light of the second color from being propagated to the region where the third light-emitting element 2003 is located. Accordingly, the display and light emission accuracy of the light-emitting panel 100 can be improved, thereby improving the light emission effect of the light-emitting panel 100.

Figure 26:
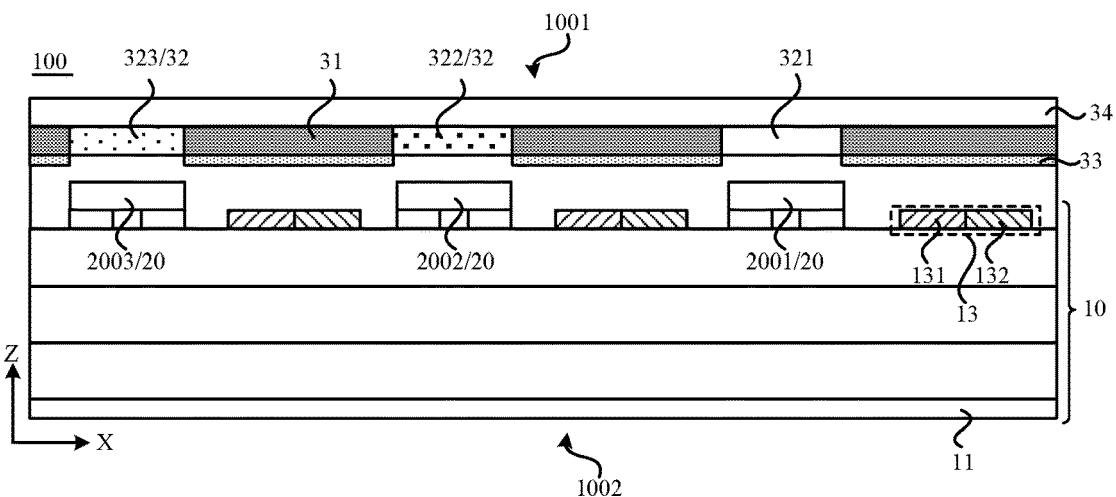
FIG. 26 is a diagram illustrating the layer structure of another light-emitting panel according to an embodiment of the present disclosure.

In an embodiment, FIG. 26 is a diagram illustrating the layer structure of another light-emitting panel according to an embodiment of the present disclosure. As shown in FIG. 26, on the basis of the preceding embodiments, the light-emitting panel further includes second reflective structures 33 located on a side of the photoelectric conversion unit 13 facing away from the base substrate 11. In the thickness direction Z of the light-emitting panel 100, a second reflective structure 33 overlaps the photoelectric conversion unit 13. Additionally, the second reflective structure 33 can reflect the light propagated toward a side of the photoelectric conversion unit 13 facing away from the base substrate 11 to the photoelectric conversion unit 13 so that the photoelectric conversion unit 13 can receive the light and convert the light into an electrical signal, thereby improving the photoelectric conversion efficiency and further improving light utilization.

The second reflective structure 33 may be located on a side of the light-shielding structure 31 facing the photoelectric conversion unit 13. With this arrangement, the light-shielding structure 31 may not shield the light reflected by the second reflective structure 33 so that the photoelectric conversion unit 13 can receive the light. In this case, the second reflective structure 33 and the light-shielding structure 31 are located in different layers.

It is to be understood that the light-shielding structure 31 may be made of a material with the function of light absorption, for example, a black colloid material. Alternatively, the light-shielding structure 31 may be a structure stacked by color conversion structures 32 of any two or more different colors; in this case, the light-shielding function can also be implemented. No special limitation to the material of the light-shielding structure is made in embodiments of the present disclosure on the premise that the light-shielding function of the light-shielding structure 31 can be implemented.

In an embodiment, with continued reference to FIG. 24, the light-shielding structure 31 may serve as the second reflective structure 33. In this case, the light-shielding structure 31 may have functions of light shielding and reflection. Accordingly, no additional second reflective structure 33 is needed, simplifying the structure of the light-emitting panel 100 and the manufacturing process of the light-emitting panel 100 and being beneficial to the low power consumption of the light-emitting panel.

It is to be noted that an example in which the color conversion structures 32 disposed in the light-emitting panel 100 help implement the color display of the light-emitting panel 100 is taken above to exemplarily describe embodiments of the present disclosure. In this case, the light-emitting elements 20 may have the same light emission color or different light emission colors. Moreover, no light-blocking structure is needed between two adjacent light-emitting elements 20. In another embodiment of the present disclosure, a light-blocking structure may also be disposed between two adjacent light-emitting elements 20.

Figure 27:
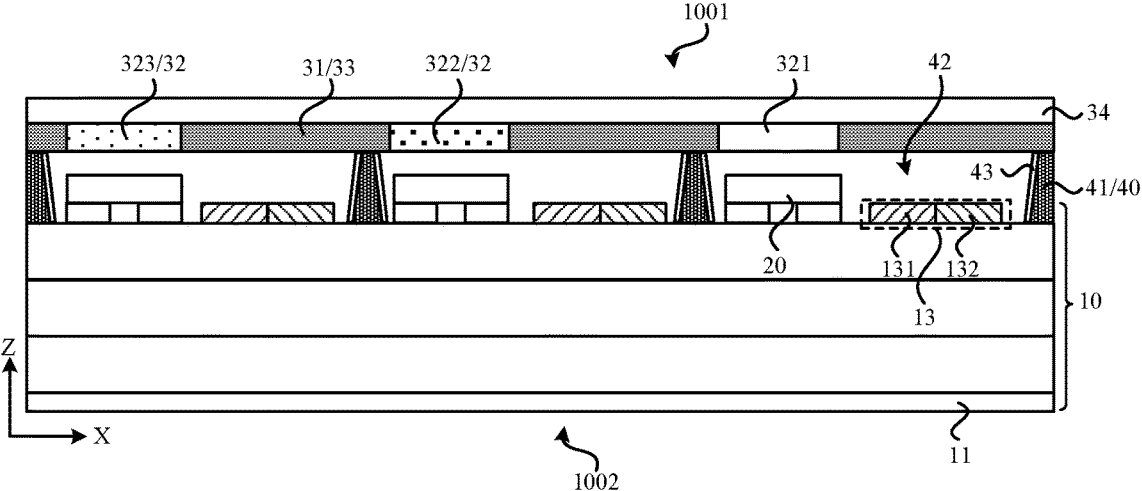
FIG. 27 is a diagram illustrating the layer structure of another light-emitting panel according to an embodiment of the present disclosure.

In an embodiment, FIG. 27 is a diagram illustrating the layer structure of another light-emitting panel according to an embodiment of the present disclosure. As shown in FIG. 27, on the basis of the preceding embodiments, the light-emitting panel 100 further includes a pixel defining layer 40 including a plurality of opening structures 42 and light-blocking structures 41 surrounding the opening structures 42. One light-emitting element 20 is disposed in each opening structure 42. In the thickness direction Z of the light-emitting panel 100, each opening structure 42 overlaps at least one photoelectric conversion unit 13. With this arrangement, in a region where an opening structure 42 is located, the light emitted by a light-emitting element 20 and toward the non-display surface 1002 can be received by a photoelectric conversion unit 13; and photoelectric conversion is performed by the photoelectric conversion unit 13. Thus light utilization can be improved. Moreover, one light-emitting element 20 is disposed in each opening structure 42. That is, two adjacent light-emitting elements 20 may be separated by a light-blocking structure 41 so that the light emitted by two adjacent light-emitting elements 20 may not generate crosstalk, thereby improving the display and light emission accuracy of the light-emitting panel 100.

In an embodiment, with continued reference to FIG. 27, a third reflective structure 43 is disposed on a side of a light-blocking structure 41 facing an opening structure. The third reflective structure 43 can reflect the light that is propagated in the first direction and in a second direction and is among the light emitted by the light-emitting element 20 so that the reflected light can be propagated toward the display surface 1001 of the light-emitting panel 100 or received by the photoelectric conversion unit 13, thereby further improving light utilization. The second direction intersects the first direction and is not parallel to the thickness direction Z of the light-emitting panel 100.

In an embodiment, referring to any one of FIGS. 24 to 27, on the basis of the preceding embodiments, the light-emitting panel 100 further includes a light-transmitting substrate 34 located on a side of the light-emitting element 20 facing away from the driving substrate 10. The light-transmitting substrate 34 can protect the light-emitting element 20 and the driving substrate 10 to a certain extent and prevent the light-emitting element 20 and the driving substrate 10 from being damaged by an external sharp object or the like. Moreover, the light-transmitting substrate 34 may be a substrate with relatively high transmittance so that the light emitted by the light-emitting element 20 has relatively high transmittance in the light-transmitting substrate 34, thereby improving the display brightness of the light-emitting panel 100. Additionally, the light-transmitting substrate 34 may also be used as a carrier substrate of another structure. For example, the light-shielding structure 31, the color conversion structure 32, and the reflective structure 33 may be manufactured by using the light-transmitting substrate 34 as a base.

In an embodiment, the light-transmitting substrate 34 may also have a relatively high thermal conductivity. For example, the thermal conductivity of the light-transmitting substrate may be greater than or equal to 1000 W/m·K. In this case, the light-transmitting substrate 34 can quickly dissipate the heat generated due to the light emission of the light-emitting element 20, thereby preventing the display brightness of the light-emitting element 20 and the service life of the light-emitting element 20 from being affected due to heat accumulation. In an embodiment, the light-transmitting substrate 34 may include, but is not limited to, a diamond substrate or a diamond-like substrate.

Based on the preceding inventive concept, an embodiment of the present disclosure also provides a display device. The display device includes the light-emitting panel described in any embodiment of the present disclosure. Therefore, the display device has the technical features of the light-emitting panel provided in embodiments of the present disclosure and can achieve the beneficial effects of the light-emitting panel provided in embodiments of the present disclosure. Similarities may be referred to the preceding description of the light-emitting panel provided in embodiments of the present disclosure and are not repeated herein.

Figure 28:
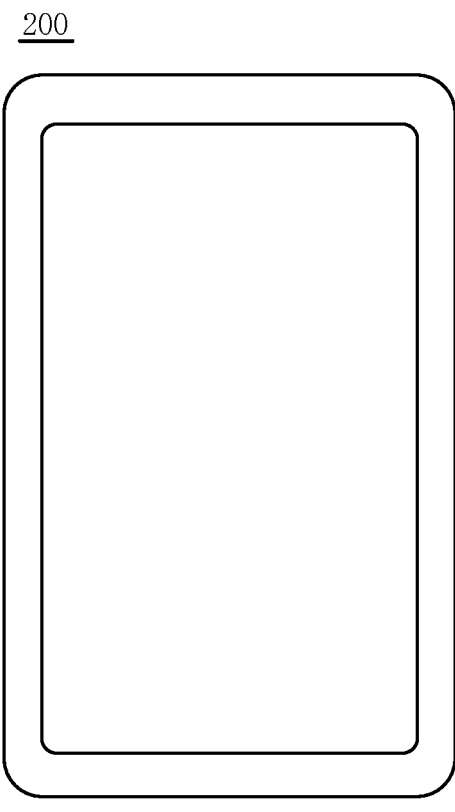
FIG. 28 is a diagram illustrating the structure of a display device according to an embodiment of the present disclosure.

In an embodiment, FIG. 28 is a diagram illustrating the structure of a display device according to an embodiment of the present disclosure. As shown in FIG. 28, the display device 200 may be any electronic product with a display function, including but not limited to phones, televisions, laptops, desktop displays, tablet computers, digital cameras, smart bracelets, smart glasses, vehicle-mounted displays, medical equipment, industrial control equipment, and touch interactive terminals. No special limitation is made thereto in embodiments of the present disclosure.

The preceding embodiments do not limit the scope of the present disclosure. It is to be understood by those skilled in the art that various modifications, combinations, sub-combinations, and substitutions may be performed according to design requirements and other factors. Any modifications, equivalent substitutions, improvements and the like made within the spirit and principle of the present disclosure are within the scope of the present disclosure.

What is claimed is:

1. A light-emitting panel, comprising:

a driving substrate, wherein the driving substrate comprises a base substrate, a plurality of driver circuits, and a plurality of photoelectric conversion units, the plurality of driver circuits and the plurality of photoelectric conversion units are located on the base substrate, and a photoelectric conversion unit of the plurality of photoelectric conversion units comprises a first doped region and a second doped region; and a plurality of light-emitting elements located on a side of the driving substrate, wherein an orthographic projection of a light-emitting element among at least part of the plurality of light-emitting elements on the driving substrate is a first projection, an orthographic projection of the photoelectric conversion unit on the driving substrate is located between two adjacent first projections, and a driver circuit of the plurality of driver circuits and the photoelectric conversion unit are each electrically connected to the light-emitting element;

wherein the driving substrate further comprises:

a first conductive layer located between the base substrate and the photoelectric conversion unit, wherein the first conductive layer comprises a plurality of first back electrodes and a plurality of second back electrodes, the first doped region is electrically connected to a first back electrode of the plurality of first back electrodes, and the second doped region is electrically connected to a second back electrode of the plurality of second back electrodes; and the first doped region is electrically connected to a second pole of the light-emitting element through the first back electrode, and the second doped region is electrically connected to a first pole of the light-emitting element through the second back electrode;

wherein the driving substrate further comprises:

a plurality of first bonding electrodes and a plurality of second bonding electrodes, wherein the plurality of first bonding electrodes and the plurality of second bonding electrodes are located on a side of the driver circuit facing the light-emitting element, wherein a first bonding electrode of the plurality of first bonding electrodes is electrically connected to the first pole of the light-emitting element, a second bonding electrode of the plurality of second bonding electrodes is electrically connected to the second pole of the light-emitting element, the first back electrode is electrically connected to the second bonding electrode, the second back electrode is electrically connected to the first bonding electrode, and the driver circuit is electrically connected to at least one of the first bonding electrode or the second bonding electrode.

2. The light-emitting panel according to claim 1, wherein the photoelectric conversion unit comprises a PN junction; and the first doped region and the second doped region are arranged in a first direction, and the first direction is parallel to a plane where the base substrate is located.

3. The light-emitting panel according to claim 1, wherein the photoelectric conversion unit comprises a PIN junction, and the photoelectric conversion unit further comprises an intrinsic region; and the first doped region, the intrinsic region, and the second doped region are arranged in sequence in a first direction, and the first direction is parallel to a plane where the base substrate is located.

4. The light-emitting panel according to claim 1, wherein the driver circuit comprises a first function structure; and the driving substrate further comprises:

a first function layer located on a side of the base substrate, wherein the first function layer comprises the first function structure, the first doped region, and the second doped region.

5. The light-emitting panel according to claim 1, wherein the driving substrate further comprises:

a plurality of first reflective structures located between the base substrate and the photoelectric conversion unit, wherein in a thickness direction of the light-emitting panel, a first reflective structure of the plurality of first reflective structures overlaps at least one of the first doped region or the second doped region;

wherein at least one of the first back electrode or the second back electrode serves as the first reflective structure.

6. The light-emitting panel according to claim 1, wherein the first conductive layer further comprises the first bonding electrode and the second bonding electrode;

wherein the first back electrode and the second bonding electrode that are electrically connected to each other is an integral structure, and the second back electrode and the first bonding electrode that are electrically connected to each other is an integral structure.

7. The light-emitting panel according to claim 1, further comprising:

a light-transmitting substrate located on a side of the light-emitting element facing away from the driving substrate;

wherein a thermal conductivity of the base substrate and/or a thermal conductivity of the light-transmitting substrate is greater than or equal to 1000 W/m·K.

8. A light-emitting panel, comprising:

a driving substrate, wherein the driving substrate comprises a base substrate, a plurality of driver circuits, and a plurality of photoelectric conversion units, the plurality of driver circuits and the plurality of photoelectric conversion units are located on the base substrate, and a photoelectric conversion unit of the plurality of photoelectric conversion units comprises a first doped region and a second doped region;

a plurality of light-emitting elements located on a side of the driving substrate, wherein an orthographic projection of a light-emitting element among at least part of the plurality of light-emitting elements on the driving substrate is a first projection, an orthographic projection of the photoelectric conversion unit on the driving substrate is located between two adjacent first projections, and a driver circuit of the plurality of driver circuits and the photoelectric conversion unit are each electrically connected to the light-emitting element; and a plurality of light-shielding structures and color conversion structures, wherein the plurality of light-shielding structures are located on a side of the light-emitting element facing away from the driving substrate, and a color conversion structure of the color conversion structures is located between two adjacent light-shielding structures of the plurality of light-shielding structures, wherein in a thickness direction of the light-emitting panel, the color conversion structure overlaps the light-emitting element, and a light-shielding structure of the plurality of light-shielding structures overlaps the photoelectric conversion unit;

wherein the light-shielding structure comprises a first light-shielding portion and a second light-shielding portion that are connected to each other, and the second light-shielding portion is located on a side of the first light-shielding portion facing the light-emitting element;

in the thickness direction of the light-emitting panel, the first light-shielding portion overlaps the photoelectric conversion unit; and in the thickness direction of the light-emitting panel, the second light-shielding portion is located between the photoelectric conversion unit and the color conversion structure; and in a first direction, the second light-shielding portion is located between the photoelectric conversion unit and the color conversion structure.

9. The light-emitting panel according to claim 8, further comprising:

second reflective structures located on a side of the photoelectric conversion unit facing away from the base substrate, wherein in the thickness direction of the light-emitting panel, a second reflective structure of the second reflective structures overlaps the photoelectric conversion unit.

10. The light-emitting panel according to claim 9, wherein the second reflective structure is located on a side of the light-shielding structure facing the photoelectric conversion unit; or the light-shielding structure serves as the second reflective structure.

11. The light-emitting panel according to claim 8, further comprising:

a light-transmitting structure located between two adjacent light-shielding structures of the plurality of light-shielding structures, wherein in the thickness direction of the light-emitting panel, the first light-emitting element overlaps the light-transmitting structure;

wherein a light emission color of the light-emitting element is a first color;

the color conversion structures comprise a second color conversion structure and a third color conversion structure, the second color conversion structure is configured to convert light of the first color emitted by the light-emitting element into a second color, and the third color conversion structure is configured to convert light of the first color emitted by the light-emitting element into a third color; and three adjacent light-emitting elements of the plurality of light-emitting elements are a first light-emitting element, a second light-emitting element, and a third light-emitting element; and in the thickness direction of the light-emitting panel, the first light-emitting element overlaps no color conversion structure, the second light-emitting element overlaps the second color conversion structure, and the third light-emitting element overlaps the third color conversion structure.

12. The light-emitting panel according to claim 1, further comprising:

a pixel defining layer comprising a plurality of opening structures and light-blocking structures surrounding the plurality of opening structures, wherein one light-emitting element of the plurality of light-emitting elements is disposed in each opening structure of the plurality of opening structures, and in a thickness direction of the light-emitting panel, the each opening structure overlaps at least one photoelectric conversion unit of the plurality of photoelectric conversion units.

13. The light-emitting panel according to claim 12, wherein a third reflective structure is disposed on a side of a light-blocking structure of the light-blocking structures facing an opening structure of the plurality of opening structures.

14. The light-emitting panel according to claim 1, wherein the driving substrate further comprises:

a plurality of switch circuits located on a side of the base substrate, wherein the photoelectric conversion unit is electrically connected to the light-emitting element through a switch circuit of the plurality of switch circuits, and the switch circuit is configured to control an electrical signal converted by the photoelectric conversion unit to be supplied to the light-emitting element when the light-emitting element emits light.

15. The light-emitting panel according to claim 14, wherein the driver circuit comprises at least one light emission control transistor, and the at least one light emission control transistor is connected in series between the light-emitting element and a drive transistor; and the switch circuit comprises a switch transistor, and the switch transistor is connected in series between the photoelectric conversion unit and the light-emitting element, at least a partial structure of the switch transistor and at least a partial structure of a light emission control transistor of the at least one light emission control transistor are disposed in a same layer;

wherein a gate of the switch transistor is electrically connected to a gate of the light emission control transistor.

16. A light-emitting panel, comprising:

a driving substrate, wherein the driving substrate comprises a base substrate, a plurality of driver circuits, and a plurality of photoelectric conversion units, the plurality of driver circuits and the plurality of photoelectric conversion units are located on the base substrate, and a photoelectric conversion unit of the plurality of photoelectric conversion units comprises a first doped region and a second doped region; and a plurality of light-emitting elements located on a side of the driving substrate, wherein an orthographic projection of a light-emitting element among at least part of the plurality of light-emitting elements on the driving substrate is a first projection, an orthographic projection of the photoelectric conversion unit on the driving substrate is located between two adjacent first projections, and a driver circuit of the plurality of driver circuits and the photoelectric conversion unit are each electrically connected to the light-emitting element:

wherein the driving substrate further comprises:

a plurality of energy storage circuits located on a side of the base substrate, wherein an energy storage circuit of the plurality of energy storage circuits is electrically connected to the photoelectric conversion unit, and the energy storage circuit is configured to store at least part of electrical signals converted by the photoelectric conversion unit;

wherein the energy storage circuit comprises an energy storage capacitor, and the driver circuit comprises at least a storage capacitor, wherein at least a partial structure of the energy storage capacitor and at least a partial structure of the storage capacitor are disposed in a same layer.

17. A display device, comprising the light-emitting panel according to claim 1.

* * * * *